US011636326B2

(12) United States Patent
Gosson et al.

(10) Patent No.: US 11,636,326 B2
(45) Date of Patent: Apr. 25, 2023

(54) SYSTEM, METHOD, AND COMPUTER DEVICE FOR TRANSISTOR-BASED NEURAL NETWORKS

(71) Applicant: blumind Inc., Ottawa (CA)

(72) Inventors: John Linden Gosson, Ottawa (CA); Roger Levinson, San Jose, CA (US)

(73) Assignee: blumind Inc., Ottawa (CA)

( * ) Notice: Subject to any disclaimer, the term of this patent is extended or adjusted under 35 U.S.C. 154(b) by 0 days.

(21) Appl. No.: 17/738,436

(22) Filed: May 6, 2022

(65) Prior Publication Data

US 2022/0374698 A1 Nov. 24, 2022

Related U.S. Application Data

(60) Provisional application No. 63/185,793, filed on May 7, 2021.

(51) Int. Cl.
*G06N 3/063* (2006.01)
*G06F 7/544* (2006.01)
(Continued)

(52) U.S. Cl.
CPC ........... *G06N 3/065* (2023.01); *G06F 7/5443* (2013.01); *H03K 5/2472* (2013.01)

(58) Field of Classification Search
CPC ... G06N 3/0635; G06F 7/5443; H03K 5/2472
See application file for complete search history.

(56) References Cited

U.S. PATENT DOCUMENTS 5,729,154 A * 3/1998 Taguchi ........... H03K 19/00384
326/86
2017/0329575 A1* 11/2017 Gu .......................... G06F 7/023
(Continued)

FOREIGN PATENT DOCUMENTS

WO 2019100036 A1 5/2019

OTHER PUBLICATIONS

Yurchuk, Ekaterina, et al. "Charge-trapping phenomena in HfO 2-based FeFET-type nonvolatile memories." IEEE Transactions on Electron Devices 63.9 (2016): 3501-3507. (Year: 2016).*
Du, Yuan, et al. "An analog neural network computing engine using CMOS-compatible charge-trap-transistor (CTT)." IEEE Transactions on Computer-Aided Design of Integrated Circuits and Systems 38.10 (2018): 1811-1819. (Year: 2018).*
(Continued)

*Primary Examiner* — Kamran Afshar
*Assistant Examiner* — Randall K. Baldwin
(74) *Attorney, Agent, or Firm* — Own Innovation; James W. Hinton

(57) ABSTRACT

Provided are computer systems, methods, and devices for operating an artificial neural network. The system includes neurons. The neurons include a plurality of synapses including charge-trapped transistors for processing input signals, an accumulation block for receiving drain currents from the plurality of synapses, the drain currents produced as an output of multiplication from the plurality of synapses, the drain currents calculating an amount of voltage multiplied by time, a capacitor for accumulating charge from the drain currents to act as short-term memory for accumulated signals, a discharge pulse generator for generating an output signal by discharging the accumulated charge during a discharging cycle, and a comparator for comparing an input voltage with a reference voltage. The comparator produces a first output if the input voltage is above the reference voltage and produces a second output if the input voltage is below the reference voltage.

17 Claims, 20 Drawing Sheets

(51) Int. Cl.
*G06N 3/065* (2023.01)
*H03K 5/24* (2006.01)

(56) References Cited

U.S. PATENT DOCUMENTS

| | | | |
|---|---|---|---|
| 2020/0019848 A1* | 1/2020 | Tran | G06F 3/0688 |
| 2020/0211648 A1 | 7/2020 | Minucci et al. | |
| 2020/0349421 A1 | 11/2020 | Tran et al. | |
| 2020/0364548 A1* | 11/2020 | Chang | G06N 3/04 |
| 2021/0125651 A1* | 4/2021 | Wang | G11C 11/5607 |

OTHER PUBLICATIONS

Gu, Xuefeng. Charge-trap transistors for neuromorphic computing. University of California, Los Angeles, 2018: i-94 (Year: 2018).*
Ozdemir, Ali. Selection Algorithms for Transistor Quantization ADC's Based on Dynamic Programming. The Pennsylvania State University, 2020: i-115 (Year: 2020).*
CIPO as ISA, International Search Report and Written Opinion for PCT/CA2022/050717, dated Aug. 19, 2022.

* cited by examiner

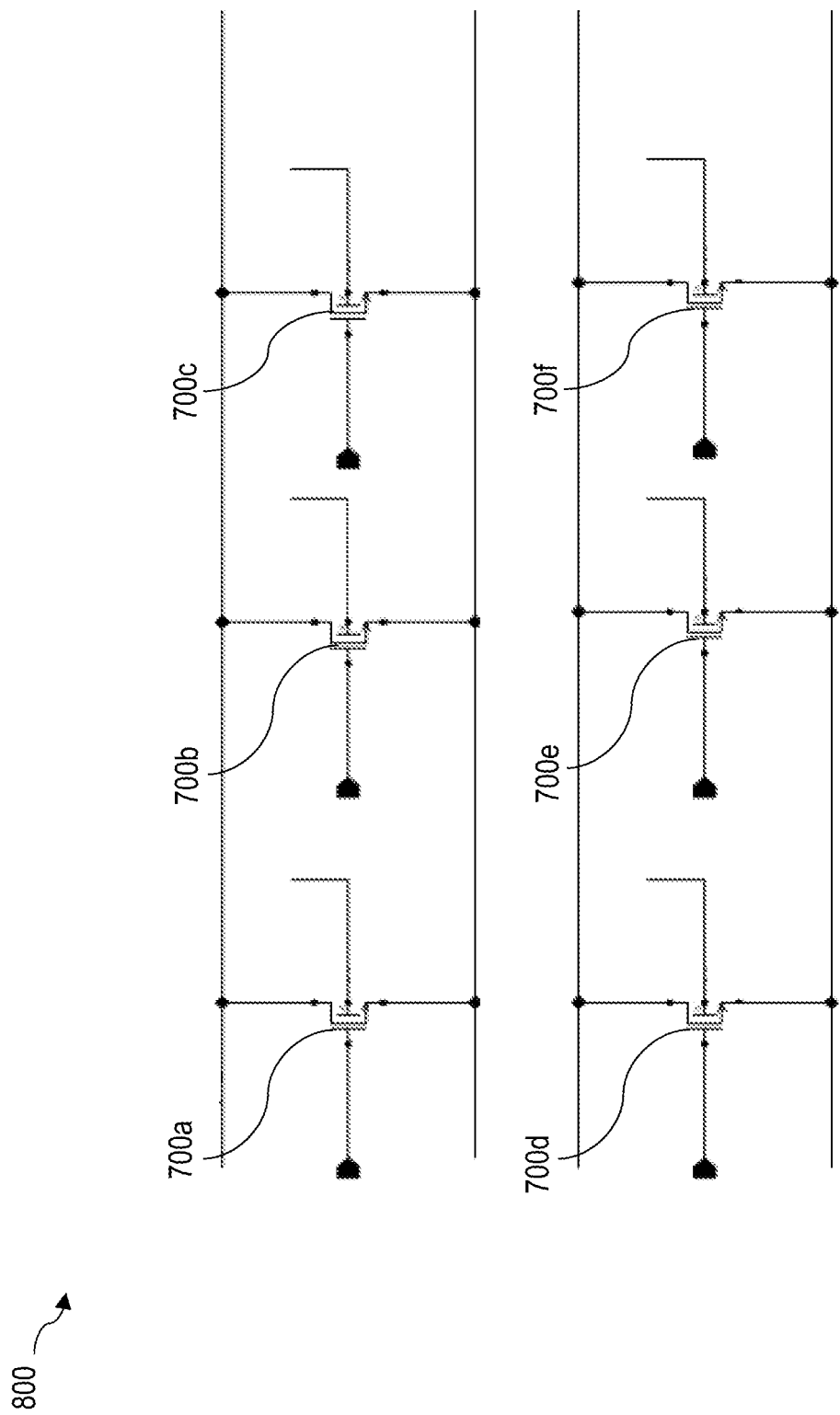

SYSTEM, METHOD, AND COMPUTER DEVICE FOR TRANSISTOR-BASED NEURAL NETWORKS

TECHNICAL FIELD

The following relates generally to neural networks and numerical computation and more specifically to systems, methods, and computer devices for analog-based neural networks and computation.

INTRODUCTION

A generalized artificial neural network (ANN) may be described as a machine learning architecture that borrows from a biological neural structure, where activation of neurons from a first input cascades on to a subsequent layer, which can cause either excitatory or inhibitory behavior of the neurons in the subsequent layer. Neural networks form the foundation for artificial intelligence systems, which are increasingly finding applications in almost every aspect of technology solutions. One of the most significant challenges to the application of neural networks and artificial intelligence to a computer problem is the total cost of ownership of the solution and specifically the power consumption of the solution. In conventional datacenters, power is not a constraint, and power-hungry processors such as CPUs and GPUs are utilized to run neural network algorithms on various data types. However, there is an urgent need to direct artificial intelligence to real-world applications. For example, in the specific case where various types of sensors generate data, power budgets become a major constraint. This constraint has driven the need for low-power methods of processing neural network algorithms, which are much more efficient than general purpose CPUs and GPUs.

In FIG. 1A, there is shown a generic conventional ANN 100. FIG. 1A depicts basic inferencing system architecture. The ANN 100 includes an input layer 102 for receiving input, a hidden layer 104 for performing computation, and an output layer 106 for providing output. Each of the input layer 102, the hidden layer 104, and the output layer 106 includes one or more neurons 108.

The ANN 100 is a machine-learning architecture that borrows its form loosely from the biological neural structure. In the biological neural structure, activation of the neurons 108 (for example, at the input layer 102) from a first input signal (not shown) cascades on to a subsequent layer (for example, the hidden layer 104). This cascade can either cause excitatory or inhibitory behavior of the neurons in the subsequent layer.

Individual neurons 108 may perform any of a variety of actions, either alone or in combination. Neurons 108 of a layer of the ANN 100 receiving the cascade may combine the values of the neurons 108 of previous layers with associated synaptic weights (not shown). The neurons 108 may apply non-linear scaling, hereinafter termed the "activation function". The foregoing combination of values is achieved through a multiplication and then summed with other products. The multiplication is performed according to the activation of the neurons 108 multiplied by the synaptic weight.

A result of the activation function may advantageously be that output of proceeding layers (for example, the hidden layer 104) cannot be linearly mapped to preceding layers (for example, the input layer 102). The non-linear scaling may advantageously allow gradient descent during the training phase. The neurons 108 may propagate the value to a subsequent layer of neurons (for example, the output layer 106).

The foregoing process is implemented in conventional neural networks (such as the ANN 100). Accordingly, important computational tasks can be implemented in the ANN 100, such as vector-matrix-multiplication, in which a vector of inputs or neuron activations, $x_i$, is multiplied by a matrix of the synaptic weights, $w_{ij}$, utilizing a multiply-accumulate (MAC) function, $(\Sigma w_{ij}*x_i)$, to generate an activation.

In implementations, products and summations are based upon absolutes, either numerical in the digital case, or voltages or currents for analog approaches. For example, in a digital implementation, the input signals and the synaptic weights may be represented by a binary number, the multiplication may be performed by a digital multiplier, and the results may be accumulated or summed as digital numbers. This method is relatively energy- and silicon-area-inefficient.

In FIG. 1B, there is shown a box diagram of the different functions that the conventional ANN 100 may perform. Individual neurons 108 may perform a variety of actions, either alone or in combination. The neurons 108 of a particular layer of the ANN 100 (such as the hidden layer 104) may perform any of the functionality recited in FIG. 1A.

At 110, the ANN 100 receives an input signal (not shown) at the input layer 102. The input layer 102 further multiplies the input signal by a synaptic weight (not shown) of a neuron 108. At 112, the ANN 100 accumulates, or adds together, results of all of the multiplications performed. At 114, the ANN adds a bias to the accumulated output of the multiplications and applies the sum to an activation function 116. At the activation function 116, the ANN performs an activation function and cascades the output of the activation function to a subsequent layer of neurons.

FIG. 2 shows a conventional digital multiply-accumulate array 200. FIG. 2 depicts a digital implementation of the multiply-accumulate array 200 capable of computing functions, such as multiply and accumulate, of a conventional ANN, such as the ANN 100 of FIG. 1.

The array 200 includes activation memory 202 for receiving output signals from previous neurons 108 in previous layers 102, 104, weight memory 204 for supplying the synaptic weights, multiply-accumulators (MACS) 205 for multiplying input signals and summing the output of the multiplication, and accumulator 206 for accumulating output signals of the MACs 205, which are added together.

The array 200 further includes a MAC unit 208 exemplifying one possible embodiment of a multiply-accumulator 205.

FIG. 11 shows a conventional analog conduction-based inferencing system 1100 using resistance to store synaptic weight to implement the ANN 100 of FIG. 1A.

In the system 1100, memory elements are used to create a resistance proportional to synaptic weight desired. The memory elements may require special processing layers in the semi-conductor fabrication. A voltage is applied across a resistor (not shown) and the resultant current is the product of input signals and weight, from Ohm's law where $I=V/R$. The weight is stored as $1/R$.

This system is dependent upon process, absolute voltage, and temperature. Any drift in these parameters over time or induced noise may introduce errors in current, which may directly impact accuracy of the calculation and the performance of a neuron implemented using the system 1100.

Careful and complex techniques may be used to compensate for these non-idealities, which incur cost and limit achievable performance. This difficulty has made analog, in-memory computing very difficult and commercially impractical. Some example technologies used for implementing these in-memory solutions are phase change memory (PCM), Resistive RAM (RRAM), FLASH memory, capacitive memory, and others. The systems, methods, and devices of the present disclosure may advantageously overcome at least some of these difficulties.

Calculations between the input layer 102 and the output layer 106 may take place according to synaptic weight 105.

The system 1100 further includes hardware 1110 for implementing the ANN 100. The hardware 1110 includes transistors 1112. Together, the transistors 1112 may form conductance pairs 1114. The hardware 1110 further includes non-volatile memory 1116.

SUMMARY

The present disclosure represents an efficient and elegant analog processing system that can be used for many purposes at minimal cost, including the purpose of neural network processing. The present disclosure represents a use and, where implemented in computer systems, methods, and devices, an embodiment including analog storage and computation mechanisms, such as utilizing a charge-trapped transistor (CTT) technique for adjusting a threshold of an N-type metal oxide semiconductor (NMOS) transistor in order to offset a threshold in a calibration mechanism. Neurons that perform functions such as multiplication, accumulation and non-linear activations in a neural network may be calibrated through the use of existing standard silicon processing technologies, such as complementary metal oxide semiconductors (CMOS).

There is a need for silicon neural network architectures implemented using analog/mixed signal design techniques to overcome the power and cost barriers inherent in intelligent systems. These analog solutions may be improved by stability mechanisms to ensure stability and reliability. Advantageously, the neural network as implemented in the foregoing embodiments is usable in everyday usage over long periods of time.

In the present disclosure, a novel architectural approach has been utilized to enable the use of a wide variety of memory types, including Charge Trapped Transistors (CTT), in which absolute voltages, currents and device characteristics do not impact accuracy. Instead of relying on an absolute voltage (or current) to properly scale values, time is used as the reference. All calculations are performed ratiometrically in time. Since obtaining a stable time reference (e.g., a crystal oscillator) is generally simple and low cost, by making all calculations relative to the stable time reference, all other dependencies may be calibrated out.

In an embodiment, the fundamental computational elements required for signal processing, including neural network processing, are implemented utilizing time or phase as the fundamental informational element. This embodiment differs significantly from conventional approaches because performance is not directly dependent upon any absolute physical references, such as voltage, current, conductance, or inductance, typically used in analog signal processing solutions. By utilizing time or phase accordingly, significant performance gains may advantageously be made over other analog computing approaches. Such advantageous performance gains include significant sensitivity to environmental and manufacturing non-idealities.

In an embodiment, information is encoded as a period of time or change in phase for period signals. Other physical phenomena may be important only in relation to an instantaneous value of a physical phenomenon in a ratiometric sense.

In an embodiment, inputs are transformed to time pulses, which are then subsequently weighted by the conductance of an element whose conductance can be programmed and updated periodically, such as a CTT storage structure, producing a scaled current pulse. The resultant charge from the current pulses is accumulated on a storage capacitor, to be used as a control signal for a comparator, such as a TIQ comparator, and subsequent propagation to either the next cascaded layer or temporary storage, such as an ephemeral memory storage.

In an embodiment, there is provided a comparator, such as a threshold inverter quantization (TIQ) comparator. In an embodiment, the TIQ comparator performs comparison and quantization. In an embodiment, the TIQ comparator includes at least one inverter in which some of the transistors act as charge-trapping devices. Each inverter includes two pairs of CTTs, each pair including a p-channel metal oxide semiconductor (PMOS) transistor and an n-channel metal oxide semiconductor (NMOS) transistor. The threshold of the TIQ comparator, for each inverter 1001 is set according to a ratio of a strength of the PMOS CTT of the inverter 1001 divided by a strength of the NMOS CTT of the inverter 1001. The strength of each transistor is understood as relating to the width of each transistor, the length of each transistor, the mobility of each transistor, and/or any other relevant parameter of each transistor or factor. The TIQ comparator device may be a CTT-calibrated TIQ comparator.

In an embodiment, there is provided ephemeral memory for retaining information temporarily to be used after a short delay in time. The ephemeral memory may include several subthreshold pass transistor logic (PTL) delay line blocks forming an inner ring of asynchronous controllable delay. The inner ring may be supported by an outer ring of D flip-flops forming asynchronous counters. This combination may work in tandem to achieve efficient short-term accurate storage of delay state.

In an embodiment, there is provided a calibration method. In an embodiment, all device behavior may be calibrated according to one designated reference structure including: weight block→current mirror→capacitor→comparator chain. Once the reference chain has been calibrated to a unit scale time, e.g., full scale charge of a 1 pF capacitor in 1 us, all current mirror/capacitor comparator chains may be calibrated using the same reference signal chain.

A system for operating an artificial neural network (ANN) is provided. The system includes neurons. Each neuron includes a plurality of synapses including charge-trapped transistors (CTTs) for processing input signals, the CTTs supplying synaptic weights, an accumulation block for receiving drain currents from the plurality of synapses, the drain currents being produced as an output of multiplication from the plurality of synapses, a capacitor for accumulating charge from the drain currents to act as short-term memory for accumulated signals, a discharge pulse generator for generating an output signal by discharging the accumulated charge during a discharging cycle, and a comparator for comparing the output signal as an input voltage with a reference voltage, the comparator producing a first output if the input voltage is above the reference voltage, and the comparator producing a second output if the input voltage is below the reference voltage.

In an embodiment, the accumulation block includes a storage device for receiving the drain currents from the plurality of synapses, a plurality of multipliers for storing the synaptic weights and performing multiplication of the synaptic weights by the input signals, and an accumulator for summing the output of the multiplication from the plurality of multipliers to yield accumulated signals.

In an embodiment, the comparator is a threshold inverter quantization (TIQ) comparator including a cascade of at least one complementary metal oxide semiconductor (CMOS) inverter. Each CMOS inverter includes a p-channel metal oxide semiconductor (PMOS) transistor and an n-channel metal oxide semiconductor (NMOS) transistor. The reference voltage corresponds to a threshold of the TIQ comparator self-generated by the TIQ comparator. The threshold of the TIQ comparator is adjustable via the PMOS transistor or the NMOS transistor. The threshold of the TIQ comparator corresponds to a ratio of a strength of the PMOS transistor divided by a strength of the NMOS transistor.

The drain currents may be produced as an output of the multiplication from the plurality of synapses and may produce a quantity of charge equal to the product of the input signals and the synaptic weights.

The drain currents may connect together before connecting to the accumulation block, the accumulation block may sum the drain currents, and the sum of the drain currents may be transmitted as the accumulated signals to the capacitor for storage.

Each CTT may perform multiplication of the drain currents representing synaptic weight and time as inputs, and all the multiplications may be accumulated on the capacitor.

The accumulation block may sum the drain currents as a wired OR function.

A threshold voltage of each CTT may be adjusted through programming to store a value of a weight for the corresponding synapse. Each CTT may include a gate to which a voltage pulse may be applied, the source of the voltage pulse may be at ground, gate-to-source voltage may be constant, and the voltage pulse may carry information using time.

Resistance may be used to store synaptic weight.

The resistance may be provided by the CTTs.

The plurality of synapses may store the synaptic weights in a threshold voltage shift of the CTTs.

Charge from a first scaled current pulse may be accumulated on the capacitor to be used as a control signal.

Integrated charge in each neuron may be proportional to the product of the input signals and the synaptic weights, and the value of the integrated charge may remain constant until discharge.

The current flowing through the CTTs may be mirrored by a current mirror to effect an accumulation of charge on the capacitor to create a voltage proportional to a sum of weighted inputs.

The discharge pulse generator may be a discharging cycle cascoded current source.

The discharge pulse generator may further transmit the accumulated signals during accumulation to achieve a subtraction function in the ANN.

There may further be provided a second reference voltage in addition to the reference voltage of the TIQ comparator.

There may further be provided a second reference voltage instead of the reference voltage of the TIQ comparator.

There may further be generated an activation pulse as the output signal.

The plurality of synapses may receive the input signals, transform a voltage of the input signals into a current, and produce a second scaled current pulse as the output signal.

The system may further include an apparatus for providing an ephemeral memory structure for retaining information temporarily between layers of the ANN. The apparatus includes an inner ring including an analog subthreshold delay block for providing asynchronous controllable delay and an outer ring including a plurality of asynchronous counters to support the inner ring. The inner ring and outer ring operate in tandem to achieve efficient short-term accurate storage of delay state.

The ANN may include an input layer for receiving input at a neuron, at least one hidden layer for multiplying the input by the synaptic weights to yield a product, adding bias to the product to yield a sum, applying the sum to an activation function, performing the activation function to yield the output signal, and cascading the output signal to a subsequent layer of neurons, and an output layer for providing the output signals. Each of the input layer, the at least one hidden layer, and the output layer include at least one neuron.

A subset of the CTTs may be NMOS CTTs.

A subset of the CTTs may be PMOS CTTs.

Each CTT may include a high-k-metal gate. Drain bias may be applied during a charge-trapping process.

Each CTT may include a gate dielectric including an interfacial layer of SiO2.

Each gate dielectric may include an interfacial layer of SiO2 and a cascaded HfSiON layer.

Each CTT may apply drain bias during a charge-trapping process to cause other carriers to be stably trapped in the gate dielectric.

A threshold voltage of each CTT may be modulated by an amount of charge trapped in each gate dielectric, each drain bias may enhance and stabilize the charge-trapping process due to enhanced local heating effects, and each threshold voltage of each CTT may be shiftable by a controlled amount and encode a parameter value.

Weight values are programmed by applying gate pulses of varying length at a set programming voltage bias. During positive programming, positive gate voltage pulses may be applied, and the threshold voltage may shifts in a first direction. During negative programming, negative pulses may be applied, and the threshold voltage may shift in a second direction opposite to the first direction.

Constant amplitude pulses may be applied to a source voltage of the gate.

The constant amplitude pulses may be propagated directly to a subsequent layer of the ANN.

The constant amplitude pulses may be passed through a non-linear function and propagated to a subsequent layer of the ANN.

The non-linear function may be rectified linear unit (ReLU).

The first output may be higher than the second output. In an embodiment, the first output may be a high output and the second output may be a low output.

The first output may be lower than the second output. In an embodiment, the first output may be a low output and the second output may be a high output.

A method for an artificial neural network (ANN) including neurons is provided. The method includes processing input signals via a plurality of charge-trapped transistors (CTTs), the CTTs supplying synaptic weights, producing drain currents as an output of multiplication from the plurality of CTTs, receiving the drain currents from the plurality of CTTs, accumulating charge from the drain currents to act as short-term memory for accumulated signals, generating an output signal by discharging the accumulated charge during a discharging cycle, and comparing an input voltage with a reference voltage at a comparator, the comparator producing a first output if the input voltage is above the reference voltage and producing a second output if the input voltage is below the reference voltage.

In an embodiment, receiving the drain currents from the plurality of CTTs includes receiving the drain currents from the plurality of synapses, storing the synaptic weights and performing multiplication of the synaptic weights by the input signals and summing the output of the multiplication to yield accumulated signals.

In an embodiment, the comparator is a threshold inverter quantization (TIQ) comparator. The TIQ comparator includes a cascade of at least one complementary metal oxide semiconductor (CMOS) inverter, each cascaded CMOS inverter including a p-channel metal oxide semiconductor (PMOS) transistor and an n-channel metal oxide semiconductor (NMOS) transistor. The reference voltage corresponds to a threshold of the TIQ comparator self-generated by the TIQ comparator. The threshold of the TIQ comparator is adjustable via the PMOS transistor or the NMOS transistor, and the threshold of the TIQ comparator corresponds to a ratio of a strength of the PMOS transistor divided by a strength of the NMOS transistor.

The input signals may be received at the CTTs, a voltage of the input signals may be transformed into a current, and a second scaled current pulse may be produced as the output signal.

The ANN may be implemented by the input layer receiving input, the hidden layer multiplying the input by the synaptic weight to yield a product, the hidden layer adding bias to the product to yield a sum, the hidden layer applying the sum to an activation function, the hidden layer performing the activation function to yield an output signal, and the hidden layer cascading the output signal to a subsequent layer of neurons.

The method may further include calibrating the ANN, and calibrating the ANN may include determining a designated reference weight block, calibrating a current mirror according to the designated reference weight block, calibrating a capacitor according to the designated reference weight block, calibrating the TIQ comparator according to the designated reference weight block, and calibrating each synaptic weight stored on the CTTs in the designated reference weight block.

After calibration the current mirror, the capacitor, and the comparator may each be in sync with the designated reference weight block. Once the calibration of the current mirror, of the capacitor, and of the comparator is complete, each neuron signal path may be matched relative to the designated reference weight block, and all neurons may be matched ratiometrically to each other.

The first output may be higher than the second output. In an embodiment, the first output may be a high output and the second output may be a low output.

The first output may be lower than the second output. In an embodiment, the first output may be a low output and the second output may be a high output.

A threshold inverter quantization (TIQ) comparator device for comparing an input voltage with a reference voltage is provided. The TIQ comparator device includes an input connection for receiving input signals, a cascade of at least one complementary metal oxide semiconductor (CMOS) inverter, each CMOS inverter including a p-channel metal oxide semiconductor (PMOS) transistor and an n-channel metal oxide semiconductor (NMOS) transistor. The TIQ comparator device further includes an output connection for transmitting output signals, a power connection for receiving power and a ground. The reference voltage corresponds to a threshold of the TIQ comparator self-generated by the TIQ comparator. If the input voltage exceeds the threshold, a second output flips to a first output, and if the input voltage falls below the threshold, the first output flips to the second output. The threshold of the TIQ comparator is adjustable via the PMOS transistor or the NMOS transistor. The threshold of the TIQ comparator corresponds to a ratio of a strength of the PMOS transistor divided by a strength of the NMOS transistor.

The PMOS transistor may be a PMOS CTT, the NMOS transistor may be an NMOS CTT, and the TIQ comparator device may be configurable to be calibrated by the CTTs.

The CTTs may be configurable to provide an adjustable threshold for the TIQ comparator to calibrate a reference value on an artificial neural network (ANN) that includes further CTTs.

A subset of the further CTTs may be PMOS devices.

A subset of the further CTTs may be NMOS devices.

The threshold voltage of the TIQ comparator device may be maintained and recalibrated by reprogramming a threshold voltage as recorded in a weight matrix.

Correlated double sampling may be used to achieve an improved cancellation of threshold shift of the TIQ comparator device.

The correlated double sampling may initialize a voltage on a capacitor.

The TIQ comparator device may be a dual-slope TIQ comparator device.

The first output may be higher than the second output. In an embodiment, the first output may be a high output and the second output may be a low output.

The first output may be lower than the second output. In an embodiment, the first output may be a low output and the second output may be a high output.

An apparatus for providing an ephemeral memory for retaining information temporarily between layers of an artificial neural network (ANN) is provided. The apparatus includes an inner ring including an analog subthreshold delay block for providing asynchronous controllable delay and an outer ring including a plurality of asynchronous counters to support the inner ring. The inner ring and the outer ring operate in tandem to achieve efficient short-term accurate storage of delay state.

The analog subthreshold delay block may include a plurality of subthreshold pass transistor logic (PTL) delay line elements.

The asynchronous counters may include a first asynchronous counter. The first asynchronous counter may be a 1-bit asynchronous sub-threshold counter. The asynchronous counters may include D flip-flops.

The apparatus may further include multiple asynchronous counters.

The multiple asynchronous counters may be 1-bit cascaded sub-threshold counters.

The ephemeral memory may function asynchronously.

Time may be stored temporarily in a nanowatt or a picowatt power consumption space.

The apparatus may receive a first activation pulse, and the apparatus may store a width of the first activation pulse via the first asynchronous counter. The apparatus may transmit the first activation pulse to a subsequent layer of the ANN by counting down on the first asynchronous counter.

The analog subthreshold delay block and the first asynchronous counter may together create a positive feedback loop with internal delay resulting in an oscillator.

The oscillator may be a self-timed oscillator that oscillates based on a frequency of the delay line elements, and the apparatus may further include a second counter clocked by the self-timed oscillator and created by the delay line elements and the first asynchronous counter.

The oscillator may be enabled when a capacitor is discharging. The oscillator may trigger the first asynchronous counter to count up when the oscillator is enabled, and when the capacitor is discharged the oscillator may be disabled and the first asynchronous counter may retain a value. The oscillator may subsequently be enabled again and the first asynchronous counter may count back down to zero during a first time. During the first time a pulse may be generated as an input to a subsequent neuron.

During a discharge period a neuron may generate the first activation pulse. When the first activation pulse is high, the first activation pulse enables the oscillator, and when the first activation pulse is low, the first activation pulse disables the oscillator and the first asynchronous counter stops, the first asynchronous counter having stored a number representing a pulse width of the first activation pulse, the first asynchronous counter further retaining the stored number for a period of time.

The period of time may be seconds.

The first asynchronous counter may count up during the first activation pulse and may count down as the apparatus applies the first activation pulse to the subsequent neuron to enable the delay line elements and may generate a second activation pulse equal to the first activation pulse.

The first asynchronous counter may be paired with the second counter configured oppositely so that as the first asynchronous counter counts down the second counter counts up to further store the width of the first activation pulse.

The second counter counting up may be enabled by an accumulator capacitor discharge cycle and may be disabled when a comparator flips state according to a threshold voltage. The first asynchronous counter counting down may be enabled by a start-of-inference signal for a subsequent layer of the ANN.

The apparatus may use dynamic logic to save space and power.

The ephemeral memory may include time-ephemeral memory.

Time may be calculated as one or more of absolute time, elapsed time, delay in time, and rate of change in time.

Time may be calculated as absolute time, and all information may be processed ratiometrically with respect to time.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings:

FIG. 8 is an exemplary layer of an ANN including a plurality of CTTs of FIG. 7, in accordance with an embodiment;

DETAILED DESCRIPTION

Figure 1A:
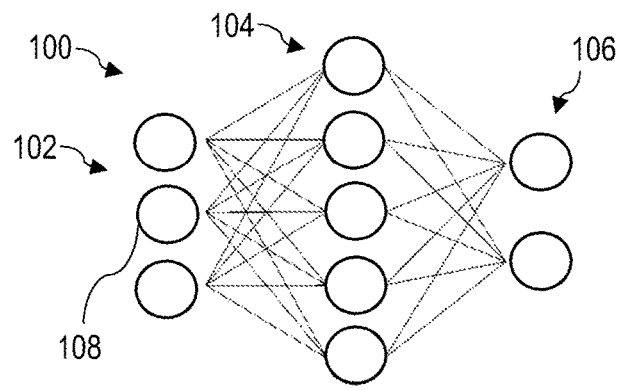
FIG. 1A is a generic conventional artificial neural network (ANN)
Figure 1B:
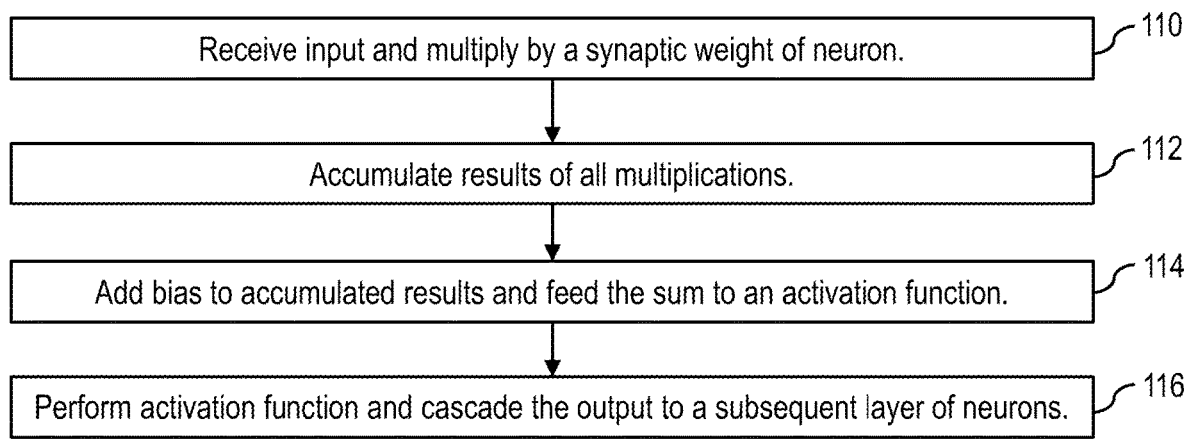
FIG. 1B is a box diagram of the different functions that the ANN of FIG. 1A may conventionally perform.
Figure 2:
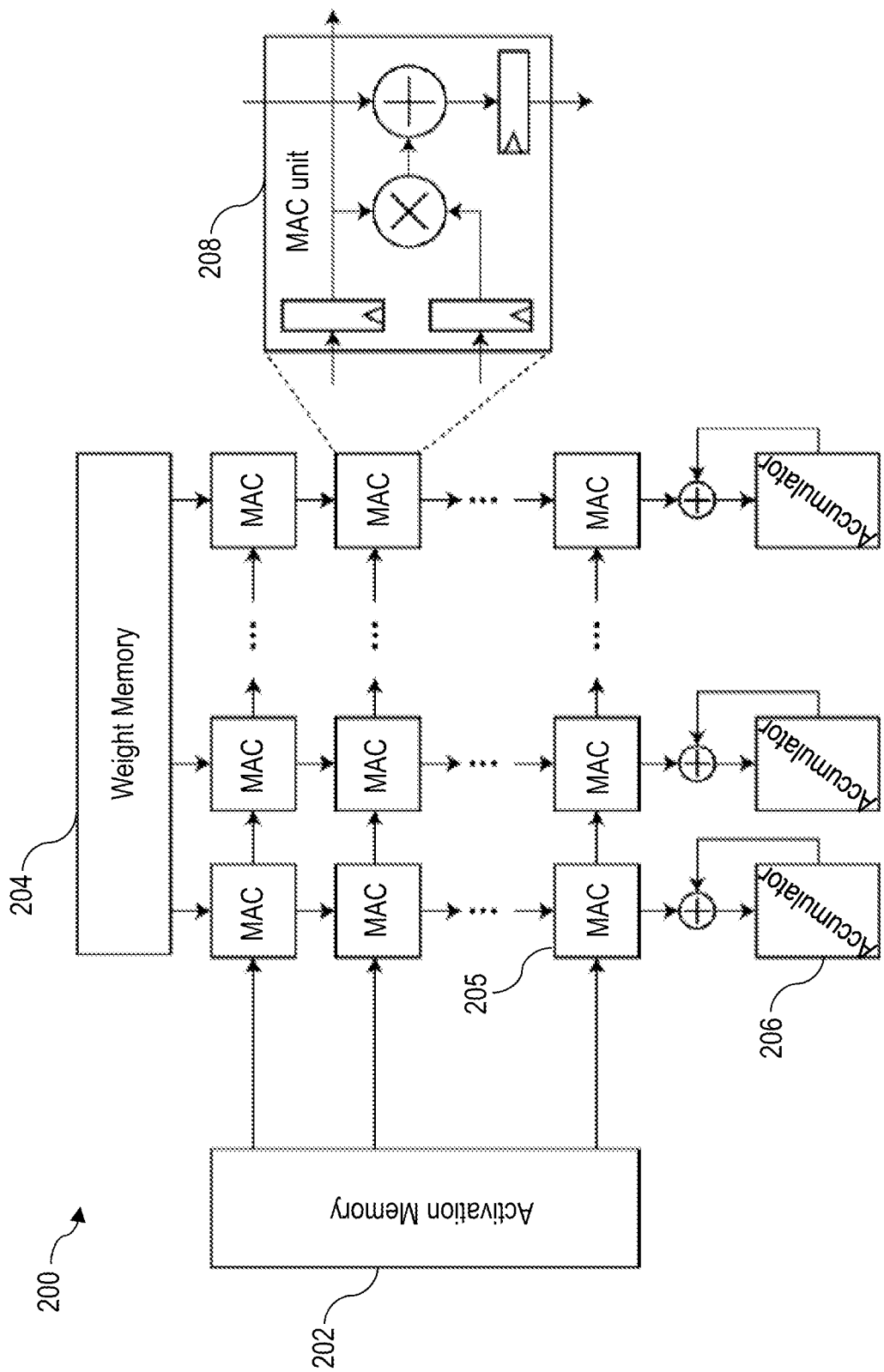
FIG. 2 is a conventional digital multiply-accumulate array.

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud-based program or system, laptop, personal data assistant, cellular telephone, smartphone, or tablet device.

Each program is preferably implemented in a high-level procedural or object-oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary, a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

The present disclosure describes a method of realizing neural networks in silicon neural network architectures, and more generally algorithmic computational functions, implemented using analog/mixed signal design techniques and stability mechanisms. Advantageously, the neural networks herein disclosed may be made for everyday usage and use over long periods of time.

Conventional computational engines fall into several categories including traditional computation, such as Von-Neuman architecture, GPU-based computation (similar to Von-Neuman architecture and tailored to heavy mathematical operations), data flow architectures, and combinations of the foregoing. Conventional solutions have been implemented in digital CMOS process technologies using conventional digital design approaches. Conventional solutions require a combination of memory and computing capability. Differences across implementations are predominantly centered around how memory and computation are implemented and how information is transferred between these elements.

The present disclosure relates to unifying the computational element with the memory element into a single device. In an embodiment, a modified data flow architecture may be utilized to advantageously process large computation workloads, such as neural networks, although the embodiment remains entirely in the analog and time domain. Advantageously, the present disclosure may lead to reduction in power consumption and area utilization relative to existing approaches.

Similarly to how the human brain processes data, a concept of the present disclosure is the principle of information related to time. Time may be measured and utilized in multiple fashions, including absolute time, elapsed time, delay in time (known as phase), and rate of change in time (frequency). In the present disclosure, time may be utilized as an absolute reference. Where time is used as an absolute reference, information is processed ratiometrically with respect to time. In embodiments utilizing analog signal processing, systems may be sensitive to and dependent upon absolute physical properties or parameters such as voltage, current, resistance, capacitance, and inductance. As physical parameters may change with time, temperature, and a manufacturing process, computational accuracy may suffer if the physical parameter absolute values are relied upon as a reference. The present disclosure focuses on time as an absolute reference for at least the foregoing reasons. Advantageously, even a slow drift over time may not impact accuracy as calculations are made ratiometrically.

In the context of results, multiple neural networks, including a fully connected neural network (FCNN), several Convolutional Neural Networks (CNN), and a Recursive Neural Network (RNN), have been modeled using the architecture as described in the present disclosure. Each device and block has been simulated using detailed SPICE device models and MOSRA reliability models for transistors based upon Physical Design Kits from the foundries for 28 nm, 22 nm and 14 nm process nodes. The results may advantageously be applicable to any technology node with transistors. The results may further advantageously be applicable to other technology nodes with devices that perform similar functions. Table 1 below shows the results for several industry standard networks and associated applications.

TABLE 1

Performance Benchmarks

|  | MNIST | NLP (Key Word Spotting) | MobileNetV2 (Image classification) |
| --- | --- | --- | --- |
| Preferred node | 22 nm | 22 nm | <=14 nm |
| Bit depth | 8 bits | 8 bits | 8 bit |
| # of Parameters | 25,000 | 288,000 | ~2.2M |
| Operations per Inference | 50,000 | 570,000 | ~300M |
| Performance (Inferences/s) | 500,000 | 20 | 2-30 fps |
| Blumind Power | 64 µW | Solution: 1 uW, NN: 28 nW | 48-720 µW |
| Power (Competition) |  | Solution: <140 µW | Embedded solutions: 10-100+ mW |
| Area | 115 µm$^2$ | 1500 µm$^2$ | 0.15 mm$^2$ |

In the fields of in-memory and analog computation, there are a number of base technologies that have gained attention and research over the past decade. Table 2 shows multiple technologies being applied to Edge AI computation as well as exemplary company names utilizing those techniques.

TABLE 2

Different technologies used for in-memory or analog computation for targeting Edge AI applications

| Example Companies | Exemplary Layer 800 of FIG. 8 Present applicant | Capacitor Array Semron | Memristor Research | Flash Memory Mythic | Neuromorphic Digital BrainChip | Analog Signal Processors AIStorm |
|---|---|---|---|---|---|---|
| In Memory | YES | NO | YES | YES | NO | NO |
| All Analog Signal Path | YES | NO* | NO | NO | NO | YES |
| nW-μW complete solution | YES | YES | NO* | NO* | NO | YES |
| Low Cost/High Silicon Density | YES | NO | NO | NO | NO | NO* |
| Standard CMOS process | YES | NO | NO | NO | YES | YES |
| Reliability/Stability (Automotive capable) | YES | NO | NO | NO | YES | NO |
| Scalable solution | YES | NO | YES | YES | YES | NO |
| Non-Volatile network storage | YES | NO | YES | YES | NO | NO |
| CNN | YES | YES | YES | YES | YES | YES |
| RNN/GRU | YES | YES | YES | YES | NO | YES |
| SNN | YES | NO* | YES | NO | YES | YES |
| Can support Edge Learning | YES | NO | YES | YES | YES | NO* |

The present disclosure may have applications in any one or more of generalized artificial intelligence for applications such as natural language processing, image processing, and natural movement processing for robotics, as well as neuromorphic computing to enable unsupervised learning and autonomous robotic assistance for home, factory, or hospitals.

Throughout the present detailed description, the term "ANN" is understood to refer to artificial neural networks, the term "CNN" is understood to refer to convolutional neural networks, the terms "CTT" and "CTTs" are understood to refer to charge-trapped transistors, the term "NMOS" is understood to refer to an "n-channel metal oxide semiconductor", the term "PMOS" is understood to refer to a "p-channel metal oxide semiconductor", and the term "CMOS" is understood to refer to a "complementary metal oxide semiconductor".

Throughout the present disclosure, CTTs may be understood as ordinary transistors that meet the technical requirements expressed herein and that perform a charge-trapping function as further described herein. A CTT is any transistor that meets the present technical requirements (for example, as expressed in discussion of FIG. 7) and performs the charge-trapping function. Therefore, except where expressly provided otherwise, any reference to a transistor is understood as including embodiments where the transistor so referenced is a CTT.

Figure 3:
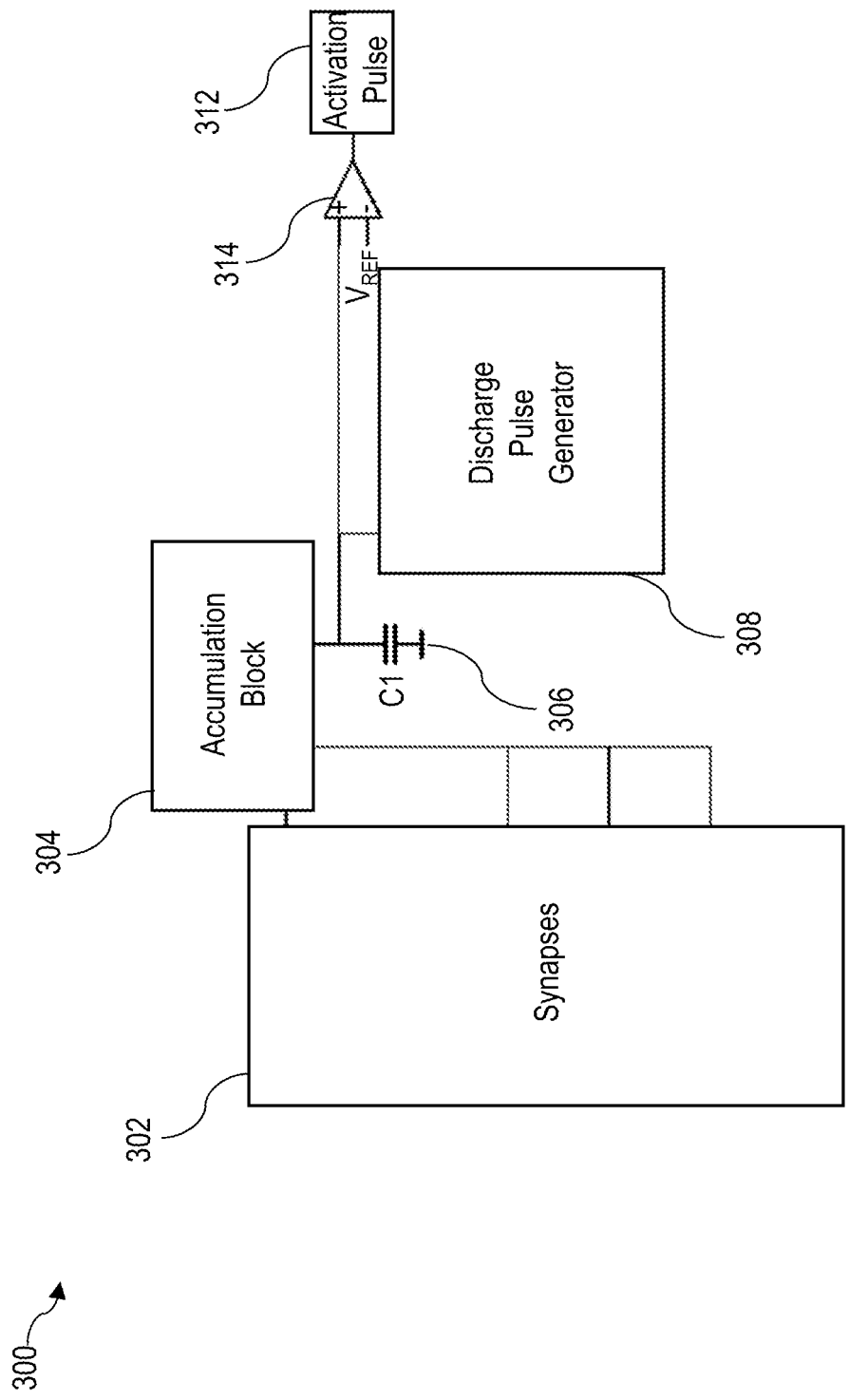
FIG. 3 is a neuron including a threshold inverter quantization (TIQ) comparator device, in accordance with an embodiment.

Referring now to FIG. 3, shown therein is a neuron 300, in accordance with an embodiment. The neuron 300 includes a plurality of synapses 302 for receiving and processing an input signal, an accumulation block 304 for accumulating the input signals, a storage capacitor 306 for storing the accumulated signals temporarily, a discharge pulse generator 308 for generating an output signal, and a comparator 314 for comparing voltages.

The neuron 300 may form part of an ANN (not shown). The neuron 300 further includes an activation pulse 312 generated for propagation to a subsequent layer of the ANN.

The plurality of synapses 302 include CTTs (not shown) for supplying synaptic weights.

The accumulation block 304 includes a storage device (not shown) for receiving drain currents (not shown) from the plurality of synapses 302. The storage device may be any storage device capable of receiving and storing currents. The storage device may be a memory. The drain currents are produced as an output of multiplication from the plurality of synapses 302. The drain currents generate an amount of charge proportional to a period of time that a fixed voltage is applied as an input.

The accumulation block 304 further includes a plurality of multipliers (not shown) for storing the synaptic weights and multiplying the synaptic weights by input signals as processed by the CTTs. The accumulation block 304 further includes an accumulator (not shown) for summing the output of the multiplication from the plurality of multipliers.

The storage capacitor 306 accumulates charge from the drain currents to act as short-term memory for accumulated signals.

The discharge pulse generator 308 generates an output signal by discharging the accumulated charge during a discharge cycle.

The comparator 314 produces a first output if a received input signal is above a reference voltage. The comparator 314 produces a second output if the received input signal is below the reference voltage. In an embodiment, the first output is higher than the second output, and the first output is termed a "high" output and the second output is termed a "low" output. In another embodiment, the first output is lower than the second output, and the first output is termed a "low" output and the second output is termed a "high" output.

In an embodiment, the comparator 314 is a threshold inverter quantization (TIQ) comparator 314 for comparing an input voltage with a reference voltage. Advantageously, in the embodiment where the comparator 314 is a TIQ comparator, the reference voltage VREF is self-generated by the comparator 314 as an inherent threshold voltage of the TIQ comparator 314.

The TIQ comparator 314 includes a cascade of at least one CMOS inverter (not shown). Each CMOS inverter includes a PMOS transistor (not shown) and an NMOS transistor (not shown). According to a transfer curve of each CMOS inverter, as the input signal goes from 0 volts to a higher voltage, a threshold of each CMOS inverter is reached, and the output flips from the second output to the first output. For example, in an embodiment, this may include the output flipping from the low output to the high output. Accordingly, the threshold acts as an implied reference voltage. Furthermore, if the input voltage falls below the threshold, the high output flips state from the first output to the second output. For example, in an embodiment, this may include the output flipping from the high output to the low output.

Where an odd number of inverters are used, each time a threshold of the cascade of CMOS inverters is reached, the output will be in a flipped state. Where an even number (greater than zero) of inverters are used, each time a threshold of the cascade of CMOS inverters is reached, the output will not be in a flipped state (i.e., the output will have flipped back).

In an embodiment, the PMOS transistors and NMOS transistors are CTTs, and the threshold of the TIQ comparator 314 is adjustable via at least one of the PMOS CTTs or the NMOS CTTs according to charge-trapping techniques.

The threshold of the TIQ comparator 314 corresponds to a ratio of a strength of the PMOS transistor divided by a strength of the NMOS transistor.

The threshold of the TIQ comparator 314 is inherent and may advantageously be adjusted according to a CTT technique. CTT devices (such as that described in relation to FIG. 7) may act to control, modify, or otherwise alter the threshold or reference voltage in order to effect operations of the neural network 300.

Ordinary comparators may not be capable of the foregoing functionality because the VREF or threshold of ordinary comparators is generated separately. Advantageously, the foregoing TIQ functionality represents a novel and inventive improvement over the ordinary comparators by minimizing the number of transistors used to perform the comparison function, eliminating the source of a reference voltage or threshold voltage, and providing a mechanism to calibrate the threshold of the TIQ comparator 314.

In the present disclosure, the foregoing functionality of the TIQ comparator 314 further includes using threshold calibration to calibrate the neuron 300.

The plurality of synapses 302 propagate input signals received as the input. The accumulation block 304 accumulates charge during a charging cycle. In an embodiment, the accumulation block 304 is a charging cycle cascoded current mirror. The storage capacitor 306 accumulates resultant charge from current pulses and acts as a form of short-term memory for the accumulated input signals.

The discharging pulse generator 308 discharges charge during a discharging cycle. In an embodiment, the discharging pulse generator 308 is a discharging cycle cascoded current source. In an embodiment, the discharging pulse generator 308 further transmits the input signals during the charging cycle to achieve a subtraction function.

There may be no explicit Vref in the neuron 300. The Vref may be built in as a threshold of the TIQ comparator 314 itself. The neuron 300 may be adjustable based on changing the built-in threshold of the TIQ comparator 314.

In an embodiment, the CTTs may be used to provide an adjustable threshold for the TIQ comparator 314, i.e., a way of calibrating the threshold of the neuron 300.

In an embodiment, a correlated double sampling may advantageously be employed to achieve an improved cancellation of threshold shift of the TIQ 314. The correlated double sampling further advantageously initializes voltage on the storage capacitor 306.

Figure 4:
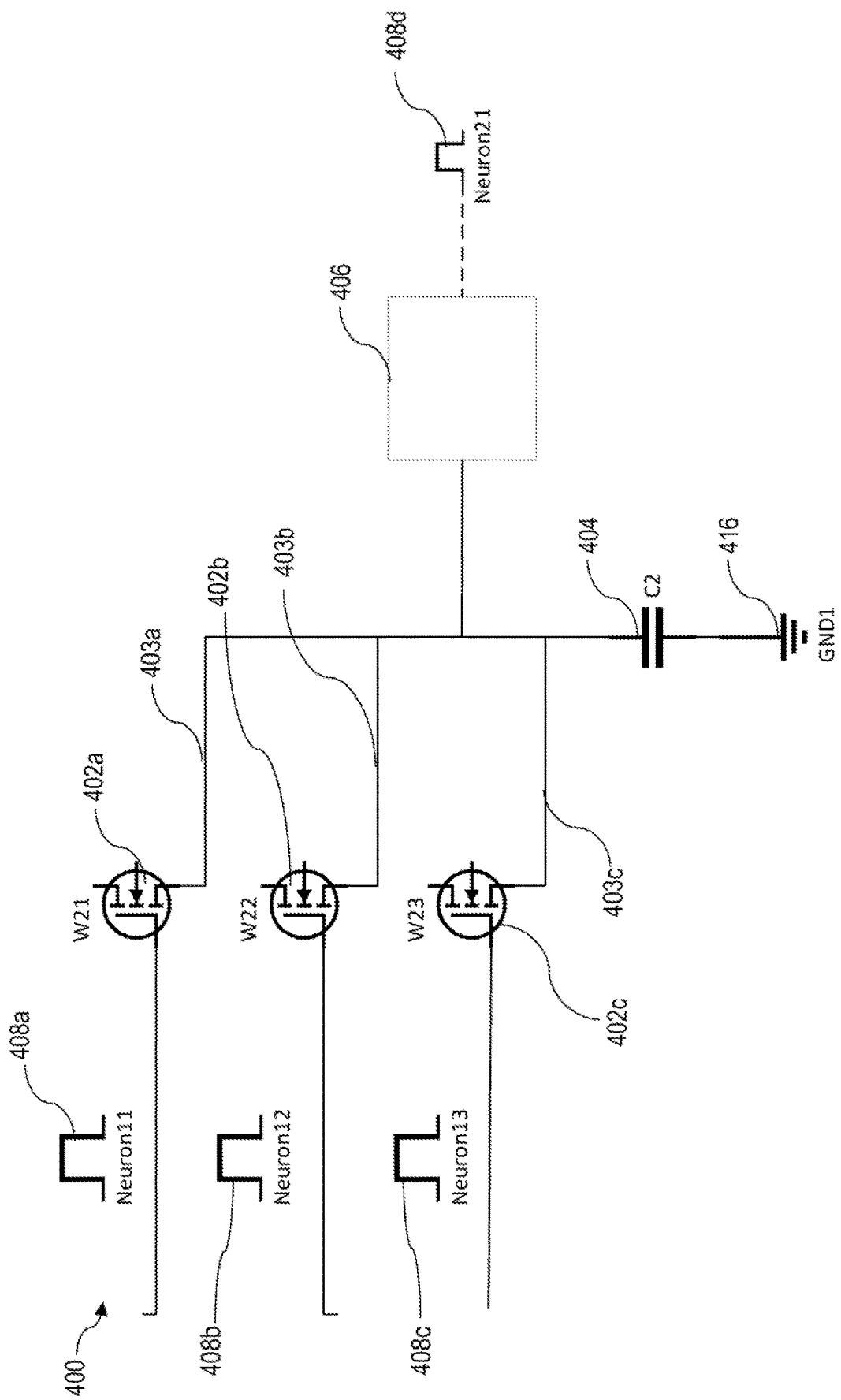
FIG. 4 is a simplified structure of a neuron utilizing charge-trapped transistors (CTTs) for weight storage as well as for multiplication, in accordance with an embodiment.

Referring now to FIG. 4, there is shown a simplified structure of a neuron 400 of the present disclosure utilizing CTTs for weight storage as well as for multiplication, in accordance with an embodiment.

The neuron 400 includes synapses 402a, 402b, and 402c for performing analog conduction-based inferencing. In an embodiment, the synapses 402a, 402b, and 402c are CTTs 402a, 402b, and 402c. Synaptic weights are stored in the threshold voltage shift of the CTTs 402a, 402b, and/or 402c.

The CTTs 402a, 402b, and 402c receive input signals 408a, 408b, and 408c, respectively. The input signals 408a, 408b, and 408c are applied to the CTTs 402a, 402b, and 402c, respectively.

The CTTs 402a, 402b, and 402c produce drain currents 403a, 403b, and 403c, respectively. The drain currents 403a, 403b, and 403c each produce a quantity of charge equal to a product of the input signals 408a, 408b, and 408c and the synaptic weights stored at each of the CTTs 402a, 402b, and 402c, respectively.

The neuron 400 further includes a storage capacitor 404 for accumulating resultant charge from the drain currents 403a, 403b, and 403c.

The neuron 400 further includes a comparator 406. The comparator 406 may be the TIQ comparator 314 of FIG. 3. In an embodiment where the comparator 406 is the TIQ comparator 314, during a discharge phase of operation of the storage capacitor 404, an output of the comparator 406 flips from the first output to the second output when a received input voltage falls below a reference voltage of the comparator 406, and the output flips from the second output to the first output when the received input voltage exceeds the reference voltage.

The comparator 406 may be a dual-slope TIQ comparator 406 and may generate an activation output. In a mixed-signal realization, inputs are transformed to time pulses, which are then subsequently weighted by a conductance of the neuron 400 to produce a scaled current pulse (not shown). Resultant charge from the scaled current pulse is accumulated on the storage capacitor 404 and subsequently discharged at a constant rate in order to generate a timing pulse 408d.

In an embodiment, the neuron 400 forms part of an ANN (not shown). The timing pulse 408d may be propagated directly to a subsequent layer of the ANN. The timing pulse 408d may be passed through a non-linear function, such as rectified linear unit (ReLU), and then propagated to a subsequent layer of the ANN. The timing pulse 408d may be stored in an ephemeral memory storage element (not shown) for future use. The ephemeral memory storage element may be time-ephemeral memory. The ephemeral memory storage element and/or the time-ephemeral memory may be the storage capacitor 404.

The neuron 400 further includes a ground 416 for serving as an electrical ground.

Figure 5:
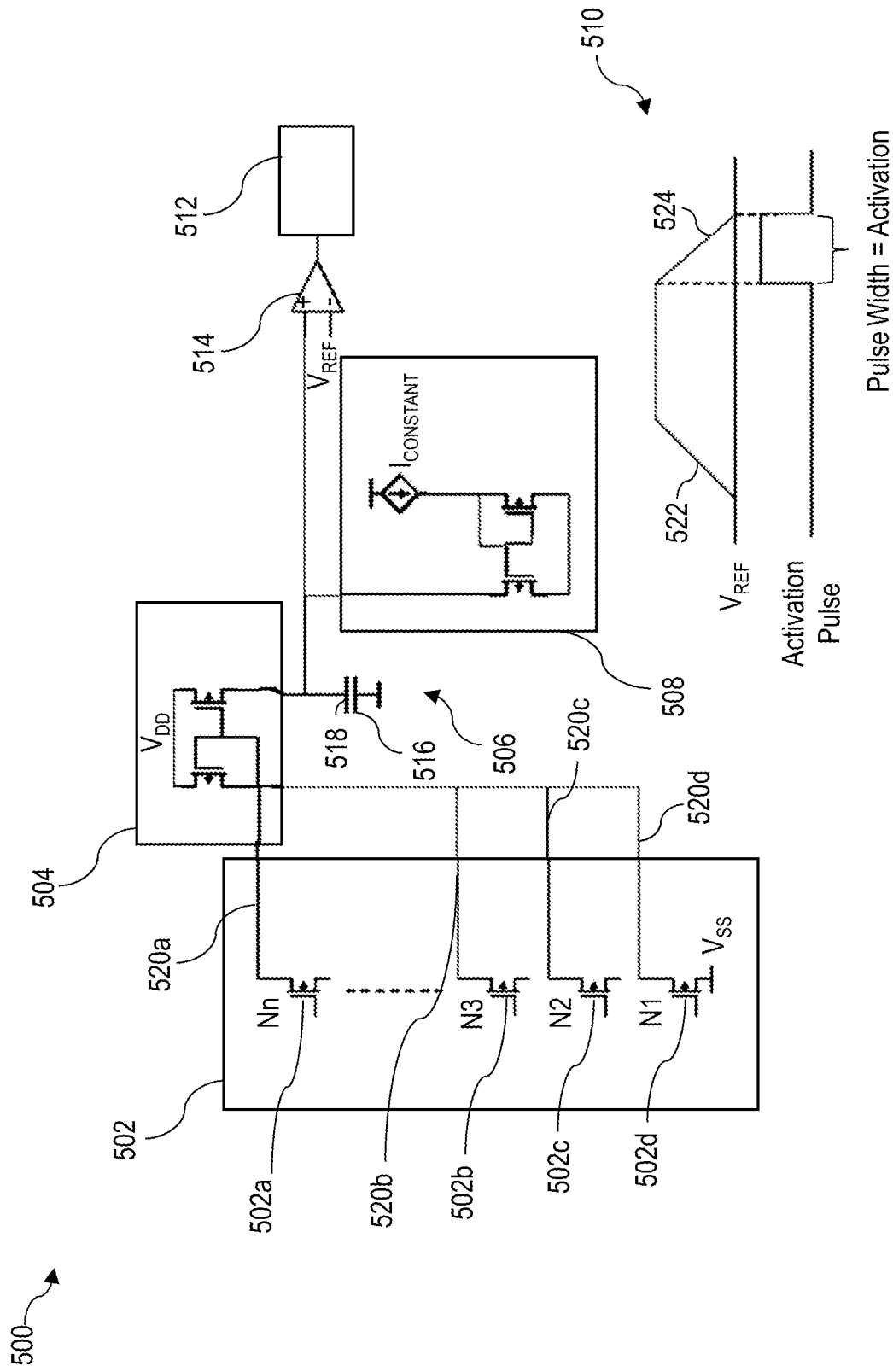
FIG. 5 is a neuron, in accordance with an embodiment.

Referring to FIG. 5, shown therein is a neuron 500, in accordance with an embodiment.

The neuron 500 includes synapses 502a, 502b, 502c, and 502d for receiving input signals (collectively referred to as the synapses 502 and generically referred to as the synapse 502) for storing and supplying synaptic weights. The synapses 502 may include any number of synapses.

The neuron 500 further includes an accumulation block 504 for accumulating the input signals, a storage capacitor 506 for storing the accumulated signals temporarily, a discharge pulse generator 508 for generating an output signal, a comparator 514 for comparing voltages, and drains 520a, 520b, 520c, and 520d (collectively referred to as the drains 520 and generically referred to as the drain 520) corresponding to each of the synapses 502 for transmitting currents from the synapses 502 to the accumulation block 504.

The neuron 500 may form part of an ANN (not shown). The neuron 500 further includes an activation pulse 512 generated for propagation to a subsequent layer of the ANN.

The synapses 502 perform a multiply function based on the received input signals and each synapse 502 generates a current for a period of time. The received input signals may be a received activation pulse 512. The period of time for which each current is generated is equal to a width of the received activation pulse 512 received at each synapse 502. Each such received activation pulse 512 may include a different width.

The drains 520 connect together before connecting to the accumulation block 504. The accumulation block 504 sums the currents transmitted through the drains 520. In an embodiment, the summing operation is equivalent to a wired OR function. Results of the summing operation at the accumulation block 504 are further transmitted as a signal to the capacitor 506.

In an embodiment, the accumulation block 504 acts as a current mirror for mirroring current flowing through the synapses 502. Advantageously, the current mirror may be used when power supply is low and circuit operation headroom is limited.

The accumulation block 504 includes a storage device (not shown) for receiving transmitted currents from the drains 520 from the plurality of synapses 502, a plurality of multipliers (not shown) for storing the synaptic weights and multiplying the synaptic weights by the transmitted currents. The accumulation block 504 further includes an accumulator (not shown) for summing the output of the multiplication from the plurality of multipliers.

The capacitor 506 includes a bottom plate 516 for grounding the neuron 500. The capacitor 506 further includes a top plate 518 for accumulating charge from the synapses 502. In an embodiment, advantageously no active integrator circuit implementation is present, and a single open loop capacitor 506 may store the accumulated charge temporarily.

A voltage pulse applied to each of the synapses 502 may begin transmission as a signal at the same time. Each such signal ceases transmission or "turns off" according to an input signal received from a previous layer of the ANN.

FIG. 5 further depicts a graph 510 showing the activation pulse 512 in the context of a changing reference voltage. A width of the activation pulse 512 is information passed from one neuron (such as the neuron 500) to a subsequent neuron across layers of the ANN. A dual-slope multiply-accumulate function as described uses time to carry activation information.

A first slope 522 of the graph 510 represents time for accumulation, i.e., for the received input signals to be added up across the drains 520. This represents the 'accumulate' stage of a 'multiply accumulate' operation.

The second slope 524 of the graph 510 represents generation of the activation pulse 512, during which time a constant reference current discharges the accumulated charge on the capacitor 506. A down current relates to a charge being discharged from the capacitor 506 by the constant current. The generated activation pulse 512 starts at the beginning of the discharge phase and stops when the voltage on the top plate 518 of the capacitor 506 drops below the threshold voltage of the comparator 514.

Figure 6:
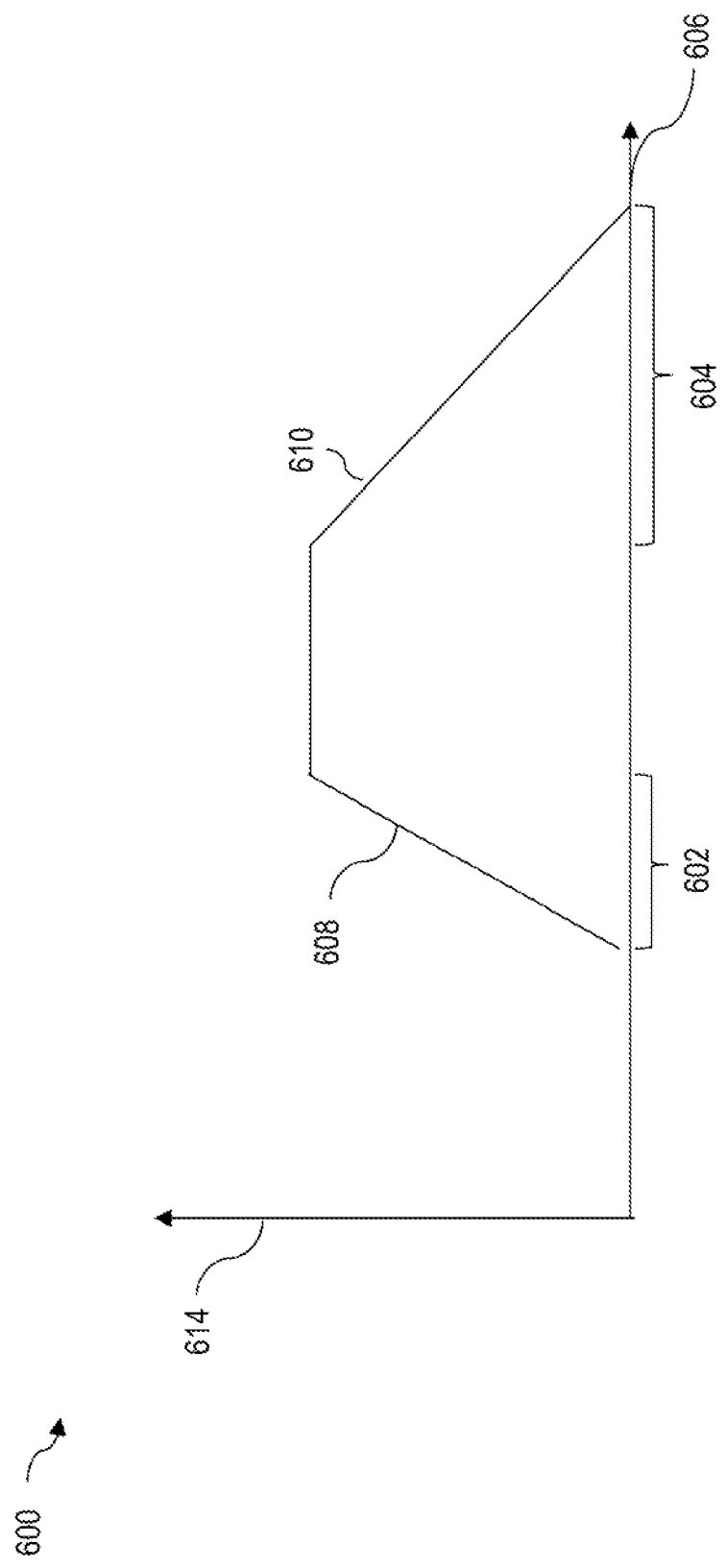
FIG. 6 shows additional details on a dual-slope pulse generation process in each neuron.

Referring now to FIG. 6, shown therein is a graph 600 depicting additional details of the dual-slope multiply-accumulate function for generating the activation pulse 512 in the neuron 500. In the graph 600, integrated charge is proportional to a multiplication product, but the absolute value of the multiplication product is not important. In an embodiment, the activation pulse is successfully generated when the value of the multiplication product remains constant until a constant-current discharge event, such as the generation of the activation pulse 512 as described with respect to FIG. 5.

The graph 600 depicts a dual-slope process used to combine multiply-accumulate functions to generate the activation pulse 512. The graph 600 includes a vertical axis 614, representing charge. The graph 600 further includes a horizontal axis 606, representing time.

Figure 13:
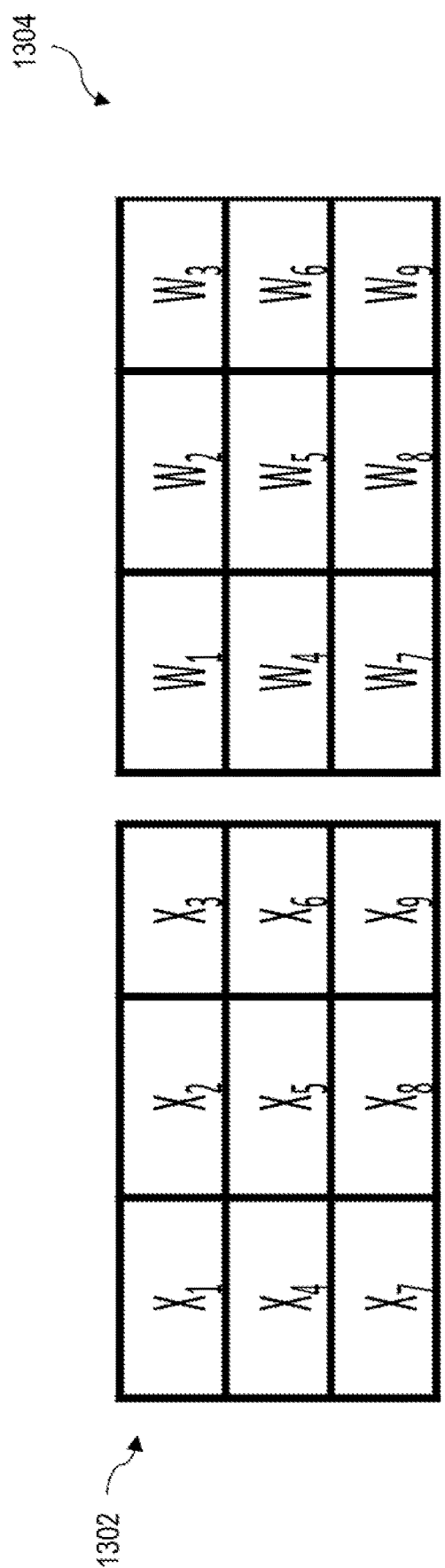
FIG. 13 depicts two 3-by-3 matrices to process.

The graph 600 includes a first region 602 in which MAC integration occurs. In the first region 602, charge accumulated on the capacitor 506 is proportional to the multiplication product. Such multiplication product may be $\Sigma(W_{ij} * X_i)$, referring to the matrices as shown in FIG. 13. The first region 602 includes a first slope 608 corresponding to a charge cycle.

The graph 600 includes a second region 604, in which discharge of the capacitor 506 occurs at a unit-standard. The rate of discharge of the capacitor 506 provides a time-ratio fraction proportional to a normalized dot product of the received input signals received at the synapses 502 and the synaptic weights stored at the synapses 502 and is used to generate the activation pulse 512 for a subsequent layer of the ANN. The second region 604 includes a second slope 610 corresponding to a discharge cycle of the capacitor 506.

The first and second slopes 608, 610 represent the charging and discharging cycles of the neuron 500, respectively. The graph 600 depicts a charge cycle where a previously generated activation pulse 512 is applied to the neuron 500. Signals are transmitted from the synapses 502 via the drain currents 520 to the accumulation block 504, and the resulting current is summed, i.e., the accumulate phase of 'multiply and accumulate'.

The graph 600 further depicts a discharge cycle. To generate a pulse width (not shown) of the activation pulse 512 that proceeds to a subsequent layer of the ANN, the capacitor 506 is discharged using a known constant current. The time the capacitor 506 takes to discharge determines the pulse width that proceeds to the subsequent layer.

Figure 7:
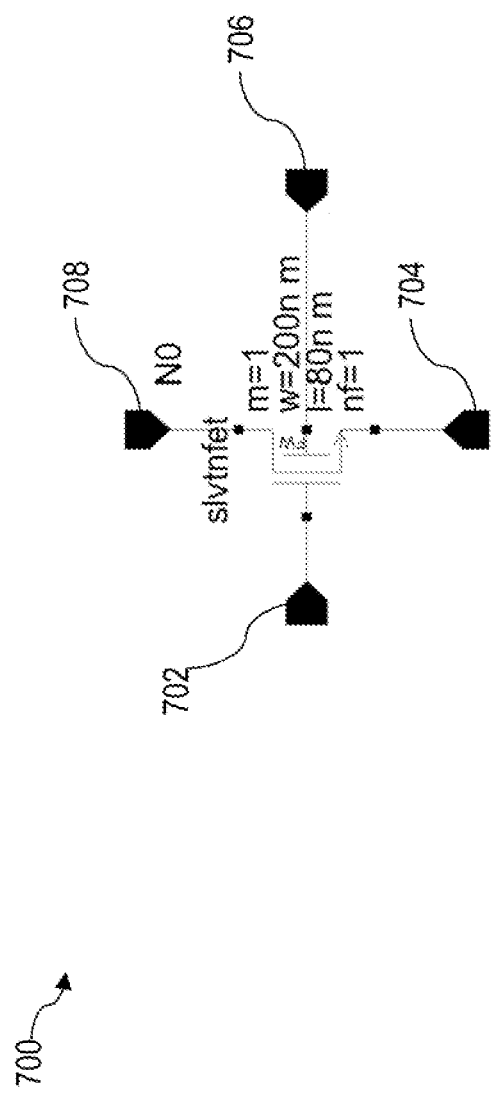
FIG. 7 is a charge-trapped transistor (CTT) suitable for use in the neurons of FIGS. 3, 4, and 5, in accordance with an embodiment.

Referring now to FIG. 7, shown therein is a CTT 700 suitable for use in the synapses 302, 402, and 502 of the neurons 300, 400, and 500 of FIGS. 3, 4, and 5, in accordance with an embodiment.

The CTT 700 includes a gate 702 for receiving an input signal. The CTT 700 includes a layer source 704 for receiving a negative reference for an input voltage (or activation). The CTT 700 includes a layer body bias 706 for facilitating possible threshold adjustment to compensate for parameters such as temperature. The CTT 700 includes a layer drain 708 for transmitting an output signal. The CTT 700 includes a gate dielectric (not shown) for interposing between the gate 702 and a substrate to which the CTT 700 is applied. The gate dielectric is used to store trapped charge and adjust the threshold voltage of the CTT 700.

In an embodiment, the CTT 700 is a charge-trapped weight-storing transistor. In an embodiment, the CTT 700 is an NMOS CTT. In an embodiment, the CTT 700 is a PMOS CTT.

CTT devices 700 have been used as multi-level non-volatile memory. Using the charge-trapping phenomenon in a transistor 700 with a high-k-metal gate 702 and applying drain bias during the charge-trapping process may enhance the charge trapping process in the CTT 700.

N-type CTTs 700 with an interfacial layer of SiO2 (not shown) followed by a cascaded HfSiON layer (not shown) as the gate dielectric are a common device type in CMOS technology process nodes smaller than 32 nm. N-type CTTs may include an interfacial layer of SiO2 followed by high-K material similar to the nitride HfSiON layer as the gate dielectric.

A threshold voltage Vt (not shown) of the CTT 700 is modulated by an amount of charge trapped in the gate dielectric of the transistor 700. A drain bias enhances and stabilizes the charge-trapping process due to enhanced local heating effects.

Using the CTT 700 for synapse multiplication is done by transmitting previous layer amplitudes as constant-voltage pulse widths that encode intensities of the neurons 300, 400, 500 and are applied to the gate 702 of the CTTs 700; the larger the input, the longer the pulse. The synapse multiplication may be weight multiplication. A resulting drain current (such as the drain currents 403, 520) is a function of a Vgs (applied input voltage) and a threshold voltage associated with the CTT 700 because Id=f(Vgs-Vt). Since all CTTs 700 begin with a nominal Vt inherent in the silicon manufacturing process, during programming of the CTT 700, the nominal Vt is shifted by an amount proportional to the weight being stored by the CTT 700. This change in Vt, or delta-Vt, represents the weight value associated with the particular device 700 or synapse 302, 402, 502. Utilizing MOSFETS in the subthreshold region allows for a log relationship between Id and (Vgs-Vt). In circuits utilizing subthreshold MOSFETs, Vt is a constant and Vgs changes. This works well when Vgs is a controlled signal. In an embodiment, however, the Vt of the CTT 700 is shifted, inducing a resulting change in Id, Vgs is applied as a pulse in time, and absolute voltage is constant.

In an embodiment, because the input information is carried by the pulse width, the foregoing proceeds with one voltage amplitude. The current flowing through the CTTs 700 is integrated by the neuron 300, 400, or 500, leading to a charge stored on the capacitor 306, 404, or 506 being equal to the summation of weighted inputs:

$$Q=\Sigma(I*t)$$

Programming of the synaptic weights (not shown) is achieved by applying gate pulses of varying length (for example, 50 us to 10 ms) at a set programming voltage bias (for example, Vgs=1.2V to 2.0V, Vds=1.0V to 1.8V), depending on technology.

In an embodiment where the CTT 700 implements a neuron (such as the neuron 500 of FIG. 5), inputs, such as neural network inputs, are transformed to time pulses (such as the activation pulse 512), where the duration of the time pulses is proportional to the magnitude of a received input signal (pulse width modulation). The time pulses are constant-amplitude pulses applied to the gate 702. Conductance of the charge trapped transistor 700 has previously been adjusted proportionally to the synaptic weight (not shown). Accordingly, drain current pulses (not shown) in the drain currents 520 from the CTT 700 produce a quantity of charge equal to the product of the time pulses received at the gate 702 and the previously stored synaptic weight. The resultant charge from the time current pulses as transmitted by the drain current pulses from the CTT 700 is accumulated on the storage capacitor 506 during the first slope 608 of the dual slope operation as shown in FIG. 6. Subsequently, a fixed current is applied to the capacitor 506, discharging the capacitor 506 during the second slope 610.

When the voltage crosses a threshold level, a comparator flips state. The comparator may be the threshold inverter quantization (TIQ) comparator 314 of FIG. 3 or the TIQ comparator 514 of FIG. 5, which in an embodiment may be CTT-calibrated. A time pulse is generated for the duration of the second slope 610, and a width of the time pulse represents the output of the neuron 500.

In the architecture of the foregoing embodiment, the drain current, I, represents the synaptic weight and t, time, is the activation input. Thus, each CTT 700 performs a multiplication of the synaptic weight and the activation pulse 512, and all of the synaptic multiplications are accumulated on a single capacitor, such as the capacitor 306 or the capacitor 506.

Referring now to FIG. 8, shown therein is an exemplary layer 800 including multiple CTTs 700, namely CTTs 700*a*, 700*b*, 700*c*, 700*d*, 700*e*, and 700*f* (collectively referred to as the CTTs 700 and generically referred to as the CTT 700), in accordance with an embodiment. The layer 800 may include any number of CTTs 700. In an embodiment, the layer 800 is the neuron 300 of FIG. 3, the neuron 400 of FIG. 4, or the neuron 500 of FIG. 5. In an embodiment, the layer 800 is an example layer of synaptic weights.

In FIG. 8, there is a drain current (not shown) as output of multiplication from synapses. Each CTT 700 generates an amount of current for a period of time. Addition is represented as the drain current taken together in the capacitor (not shown).

Figure 9B:
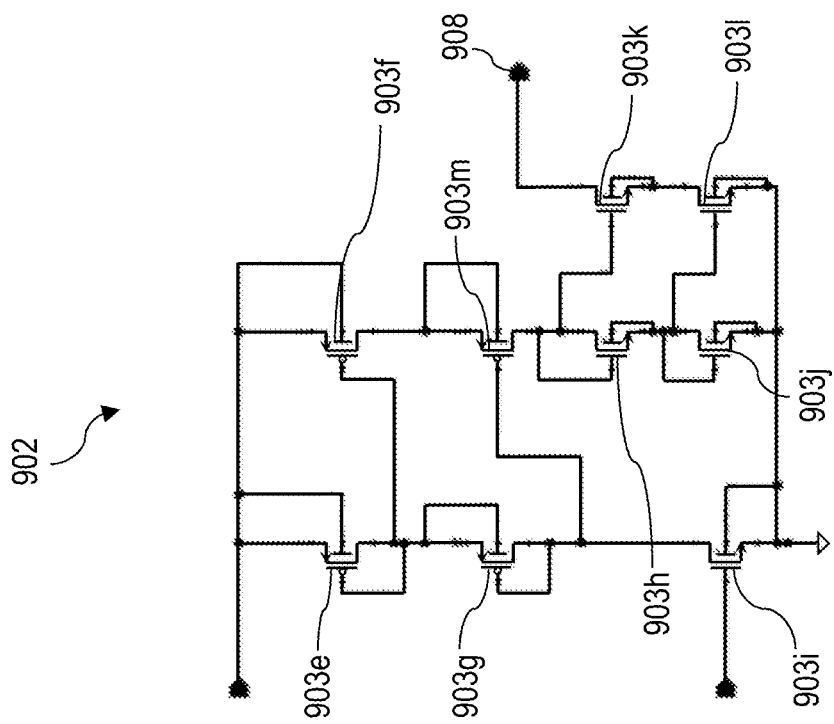
FIG. 9B is a cascoded current mirror, in accordance with an embodiment.
Figure 9A:
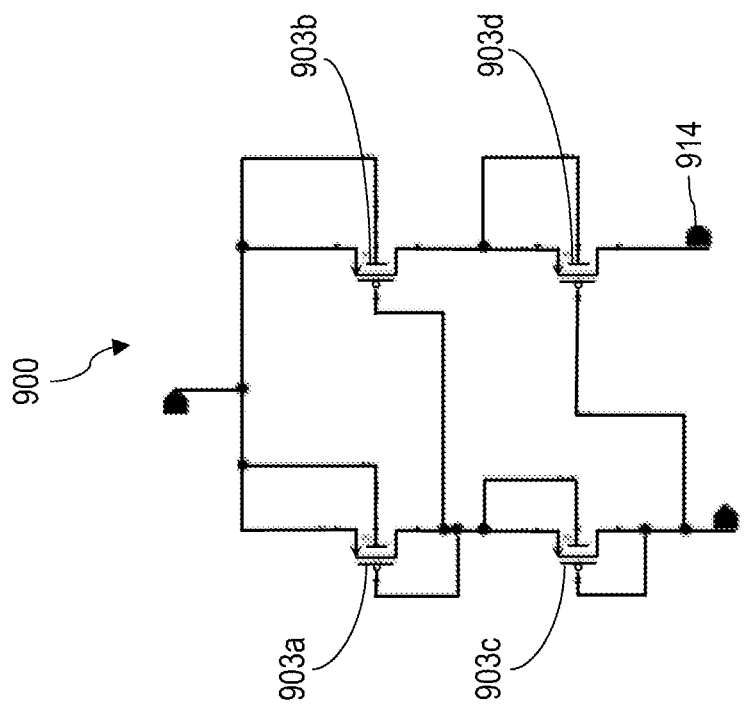
FIG. 9A is a cascoded current mirror, in accordance with an embodiment.

Referring now to FIGS. 9A and 9B, shown therein are current mirrors 900 and 902, respectively, according to an embodiment.

The current mirror 900 includes transistors 903*a*, 903*b*, 903*c*, and 903*d*. In an embodiment, the transistors 903*a*, 903*b*, 903*c*, and 903*d* are not CTTs 700 because the transistors 903*a*, 903*b*, 903*c*, and 903*d* do not perform a charge-trapping function.

The current mirror 902 includes transistors 903*e*, 903*f*, 903*g*, 903*h*, 903*i*, 903*j*, 903*k*, 9031, 903*m*. In an embodiment, the transistors 903*e*, 903*f*, 903*g*, 903*h*, 903*i*, 903*j*, 903*k*, 9031, and 903*m* are not CTTs 700 because the transistors 903*e*, 903*f*, 903*g*, 903*h*, 903*i*, 903*j*, 903*k*, 9031, and 903*m* do not perform a charge-trapping function.

The design of the current mirrors 900 and 902 exhibits several design constraints: that of good matching, high output impedance, and fast transient response. In order to achieve good matching, the transistors 903*a*, 903*b* advantageously have matching terminal voltages, specifically Vg and Vd. Such matching voltages are advantageously achieved through the use of a cascoded current mirror structure. The cascoded current mirror structure achieves excellent matching of Vg and Vd. Moreover, the cascoded current mirror structure demonstrates high output impedance, in this case at nodes 914 and 908. Utilizing the cascoded current mirror structure with the transistors 903*a*, 903*b*, 903*c*, 903*d*, 903*e*, 903*f*, 903*g*, 903*h*, 903*i*, 903*j*, 903*k*, 9031, and 903*m* biased in the subthreshold operating region further enhances the performance of the cascoded current mirrors 900, 902.

In an embodiment, the cascoded current mirror 900 of FIG. 9A may be the accumulation block 304 of the neuron 300 of FIG. 3. In an embodiment, the cascoded current mirror 902 of FIG. 9B may be the discharging pulse generator 308 of the neuron 300 of FIG. 3.

The current flowing through the CTTs 700 may be mirrored by the cascoded current mirror 902, leading to an accumulation of charge on the capacitor 306 creating a voltage proportional to the summation of weighted inputs: V=1/CΣ(I*t).

Figure 10:
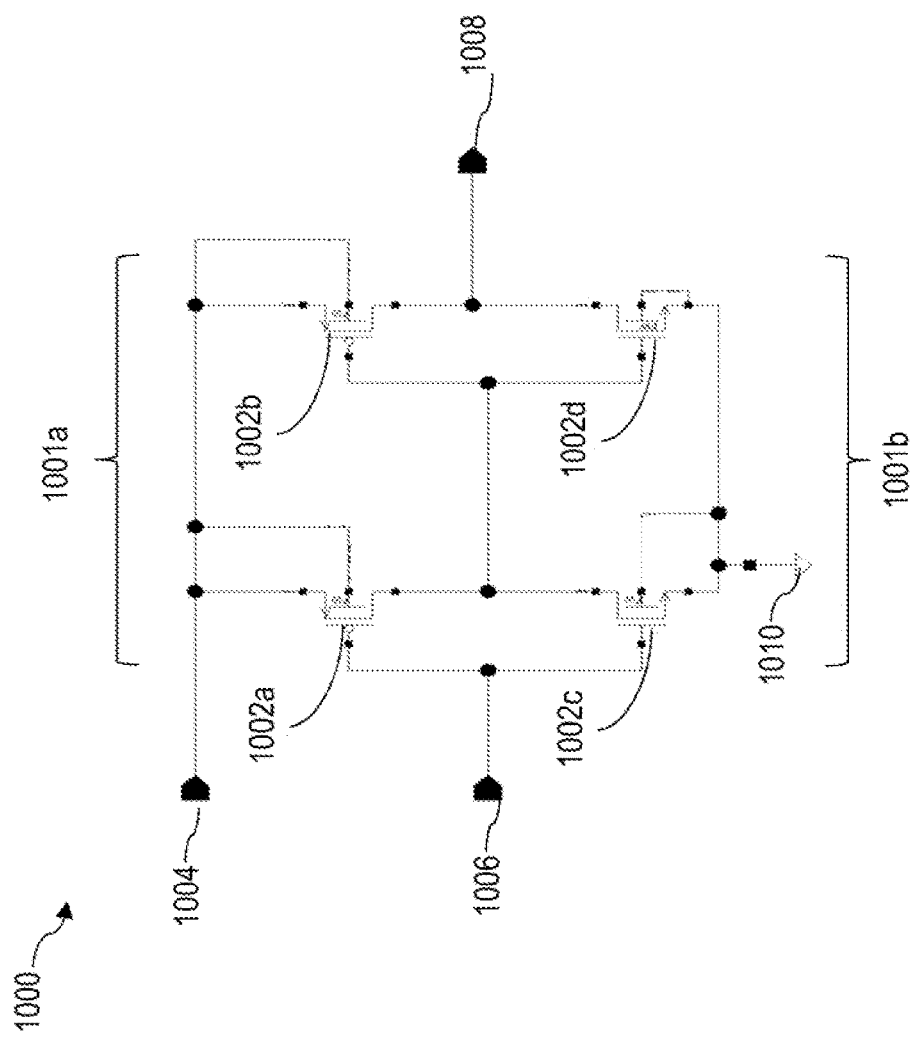
FIG. 10 is the TIQ comparator device of FIGS. 3 and 5, in accordance with an embodiment.
Figure 11:
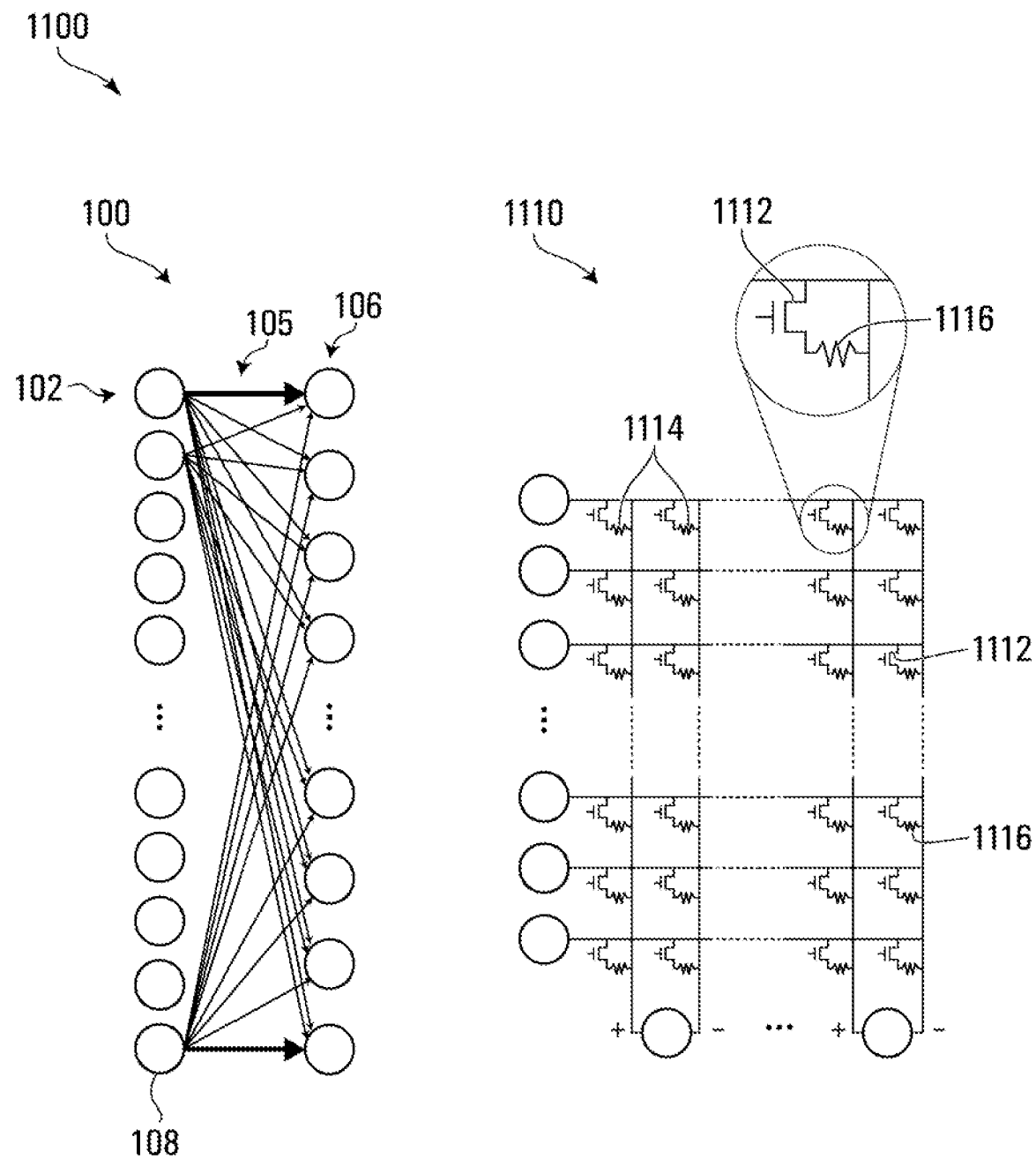
FIG. 11 is a conventional analog conduction-based inferencing system using resistance to store synaptic weight.

Referring now to FIG. 10, shown therein is a threshold inverter quantization (TIQ) comparator device 1000 for threshold inverter quantization comparison, in accordance with an embodiment. The TIQ comparator device 1000 may be the TIQ comparator device 314 of FIG. 3.

The TIQ comparator device 1000 includes a cascade of two CMOS inverters 1001a, 1001b (collectively referred to as the inverters 1001 and generically referred to as the inverter 1001) for producing a first output if a received input signal is above a reference voltage of the TIQ comparator device and producing a second output if the received input signal is below the reference voltage. The TIQ comparator device 1000 further includes an input connection 1006 for receiving input signals. The TIQ comparator device 1000 further includes an output connection 1008 for transmitting output signals. The TIQ comparator device 1000 further includes a power connection 1004 for receiving power. The TIQ comparator device 1000 further includes a ground 1010 for grounding the TIQ comparator device 1000.

In an embodiment, the first output is higher than the second output. In such an embodiment, the first output is termed a "high" output and the second output is termed a "low" output.

In an embodiment, the first output is lower than the second output. In such an embodiment, the first output is termed a "low" output and the second output is termed a "high" output.

Each inverter 1001a, 1001b includes a PMOS transistor 1002a, 1002c and an NMOS transistor 1002b, 1002d, respectively (the transistors 1002a, 1002b, 1002c, 1002d are collectively referred to as the transistors 1002 and generically referred to as the transistor 1002). Each of the transistors 1002 may be a CTT 700. The threshold of the TIQ comparator 1000, for each inverter 1001, is set according to a ratio of a strength of the PMOS transistor 1002 divided by a strength of the NMOS transistor 1002. The strength of each transistor 1002 is understood as relating to the width of each transistor 1002, the length of each transistor 1002, the mobility of each transistor 1002, and/or any other relevant parameter or factor of each transistor 1002. Furthermore, fine adjustment and calibration may be maintained by the re-programming of the threshold voltage using the same method as in a weight matrix 1302 as shown in FIG. 13. The TIQ comparator device 1000 may be a CTT-calibrated TIQ comparator device 1000.

In FIG. 10, a threshold voltage of the transistors 1002 may be adjusted to calibrate TIQ offset.

Advantageously, the offset of the TIQ comparator device 1000 may be calibrated by adjusting any one of the transistors 1002 in the TIQ comparator device 1000.

The threshold voltage of the TIQ comparator device 1000 is self-generated by the TIQ comparator device 1000. If an input voltage as received via the input connection 1006 exceeds the threshold voltage, a first output of the TIQ comparator device 1000 flips to a second output and is transmitted via the output connection 1008. If the input voltage as received via the input connection 1006 falls below the threshold voltage, the second output flips to the first output and is transmitted via the output connection 1008.

Figure 12:
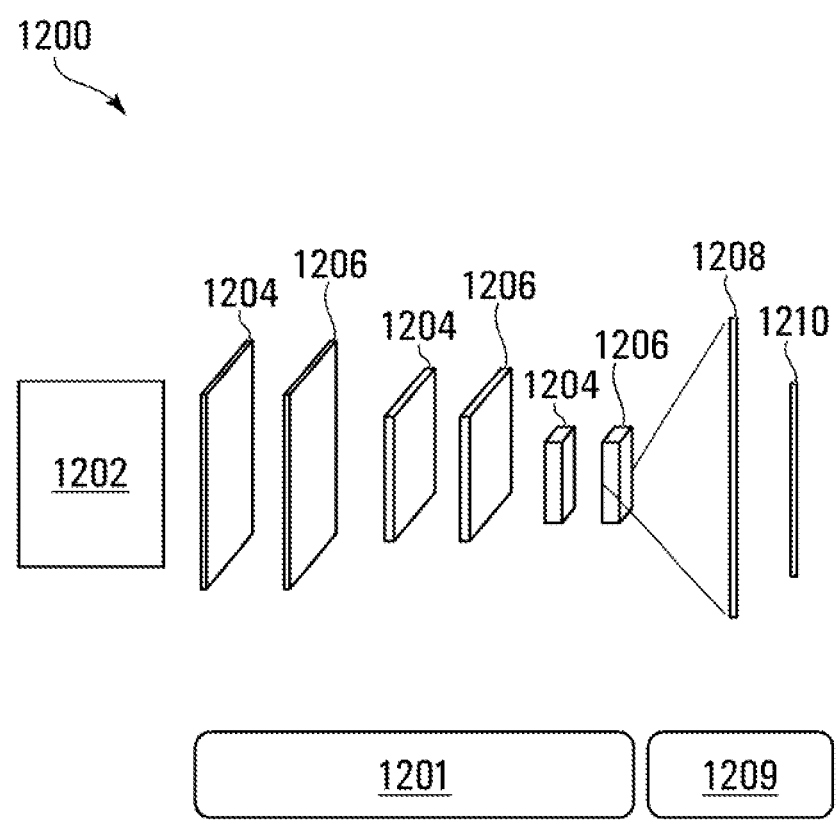
FIG. 12 is a convolutional neural network (CNN), in accordance with an embodiment.

Referring now to FIG. 12, shown therein is a CNN 1200, in accordance with an embodiment, provided as an example to illustrate how a neural network may be constructed using the architecture of the present disclosure. FIG. 12 is a simplified diagram of the CNN 1200 for image classification. The CNN 1200 may be implemented by neurons (e.g., the neuron 500 of FIG. 5) arranged into layers.

The CNN 1200 includes convolutional layers 1204, pooling layers 1206, fully connected layers 1208, hidden layers (not shown), and an output layer 1210.

Together, the convolutional layers 1204 and the pooling layers 1206 may be considered a feature extractor 1201 for extracting features of an input image 1202.

Together, the fully connected layer 1208 and the output layer 1210 may be considered a classifier 1209 for classifying the input image 1202. In an embodiment, the classifier 1209 may further transmit an output signal (not shown) corresponding to a classification of the input image 1202.

In FIG. 12, each layer 1204, 1206, 1208 includes neurons (not shown), such as the neuron 500. Each neuron of FIG. 12 includes synapses (not shown), such as the synapses 502 of FIG. 5. The synapses of FIG. 12 include CTTs, such as the CTTs 700 of FIG. 7. A threshold voltage of the CTT 700 is adjusted through programming to store a value of a synaptic weight for the synapse 502. A voltage pulse (not shown) is applied to a gate 702 of each CTT 700. Advantageously, the source may be at ground. Gate-to-source voltage may be constant, but the voltage pulse, using time, carries information for an activation input.

Figure 14:
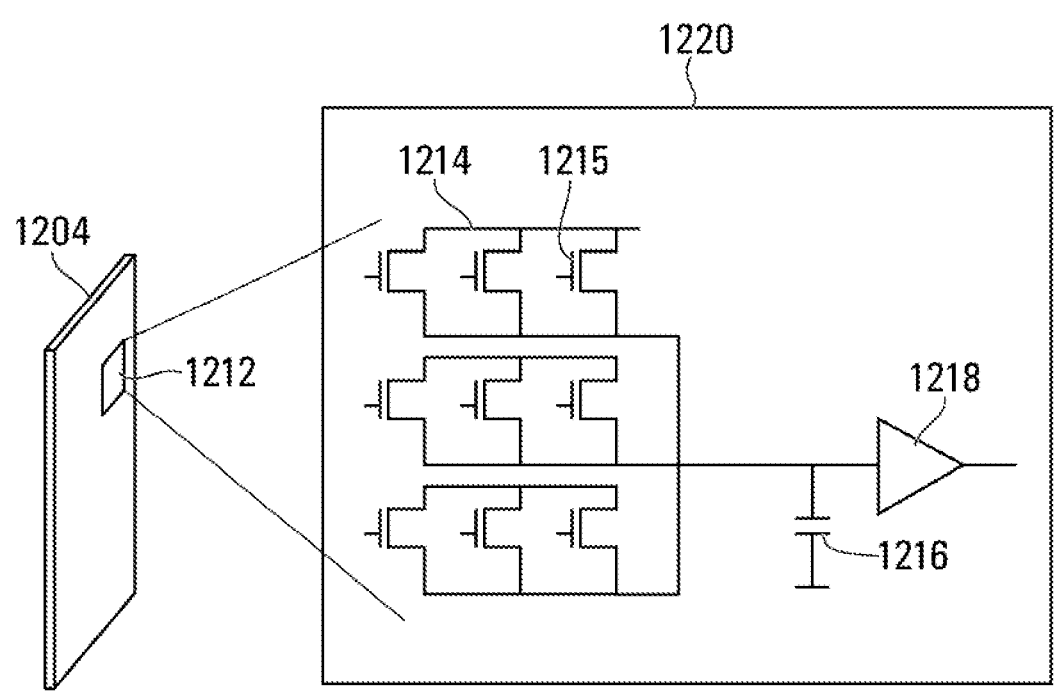
FIG. 14 is an implementation of a 3-by-3 convolutional neuron via simplified synapses in the CNN of FIG. 12, in accordance with an embodiment.

In FIG. 14, an exemplary computation in the convolutional layers 1204 is examined. The input image 1202 is a 2-dimensional array of pixel values which represent an image. Each convolutional layer 1204 performs 2-dimensional "dot" products on the pixel values received. The input image 1202 is broken down into smaller computational units, such as 3-by-3 or 5-by-5 matrices. As shown in FIG. 13, 3-by-3 matrices are provided as an example.

In FIG. 13, a portion of the input image 1202 is represented by a 3-by-3 matrix 1302 of pixel values (X1, X2 ... X9) received as inputs to a neuron, such as the neuron 500, in the convolutional layer 1204. Feature weight parameters (W1, W2 ... W9) associated with a feature filter are represented by a 3-by 3-matrix 1304. The dot product of the two matrices 1302, 1304 is equal to the sum of the products of each cell in the two matrices 1302, 1304, according to the following equation:

$$\boxed{x*w} = X_1*W_1 + X_2*W_2 \ldots + X_9*W_9$$

Referring back to FIG. 14, shown therein is an implementation of a convolutional neuron 1220 in a convolutional layer 1204 of the CNN 1200. The convolutional neuron 1220 includes a synapse matrix 1214 utilizing CTTs 1215 for computing the multiplication portion of the dot product. The convolutional neuron 1220 further includes a capacitor 1216 for accumulating outputs of the synapse matrix 1214 and a comparator 1218 for comparing voltages. The comparator 1218 may be the TIQ comparator 314. An activation pulse (not shown) is generated at the output of the comparator 1218.

The convolutional neuron 1220 receives input data 1212. The input data 1212 may be in the form of a matrix.

In an embodiment, the input data 1212 is an input signal.

In an embodiment, the input signal is propagated from a previous layer of the CNN 1200.

In an embodiment, the convolutional neuron 1220 is in a first layer of the CNN 1200 and the input data 1212 is an input to the CNN 1200 from outside the CNN 1200.

In an embodiment, the input data 1212 includes the matrices 1302, 1304 of FIG. 13.

The convolutional neuron 1220 may be a neuron 300 of FIG. 3 or a neuron 500 of FIG. 5.

In FIG. 14, the products of the input data 1212 are passed to a subsequent layer of the CNN 1200, such as a pooling layer 1206 (not shown) or stored in ephemeral memory (not shown) as a signal.

For fully connected, feedforward neural networks, multiple activation pulses (such as the activation pulse 512 of FIG. 5) may not be maintained for a single neuron (such as the neuron 500 of FIG. 5). However, for ANNs which reuse the activation pulses multiple times, such as CNNs, the activation pulses generated at the output of 1218 may be temporarily stored prior to processing with a subsequent layer of the ANN. For these ANNs, the ephemeral memory is used to store widths of the activation pulses for a temporary period of time.

In an embodiment, the convolutional neuron 1220 is implemented by the CTTs 700 of FIG. 7. During positive programming, positive gate voltage pulses may be applied to the gate 702 of the CTTs, and a threshold voltage of each CTT 700 may shift in a positive direction. During negative programming, negative gate voltage pulses may be applied to the gate 702, and the threshold voltage of each CTT 700 may shift in the opposite direction.

During synapse multiplication, absolute value of the physical parameters of hardware implementing the ANN is not critical due to calibration applied to the ANN.

It should be noted that the product of the multiplication function is charge (i.e., I*t) and that the summation of the synaptic outputs (i.e., charges) may be stored on the capacitor (such as the capacitor 306 or the capacitor 506). In the memory architectures described herein, an activation pulse (not shown) may not be converted to digital to store in memory, as the activation pulse may advantageously be used by the subsequent layer of the ANN directly. If the convolutional neuron 1220 is utilized to generate more than one activation pulse, then each activation pulse may be stored by the ephemeral memory.

In an embodiment, in the context of calibration, an overall neural network algorithm implementing the ANN advantageously depends only upon the relative relationship between neuron activation pulse widths (not shown). There is no dependence upon absolute voltage, current, or charge. To ensure that all of the neurons of the ANN are relatively accurate, the entire path for each neuron (such as the neuron 300 of FIG. 3), including each of its synapses (such as the synapses 302) may be calibrated relative to a single "golden" neuron (not shown). Such calibration may advantageously ensure that all neurons maintain a constant relationship to the golden neuron, thus maintaining ratiometric accuracy. In the embodiment, there are several calibrations involved in the solution, including initial programming calibration, continuous temperature calibration, and periodic CTT drift calibration.

Figure 15:
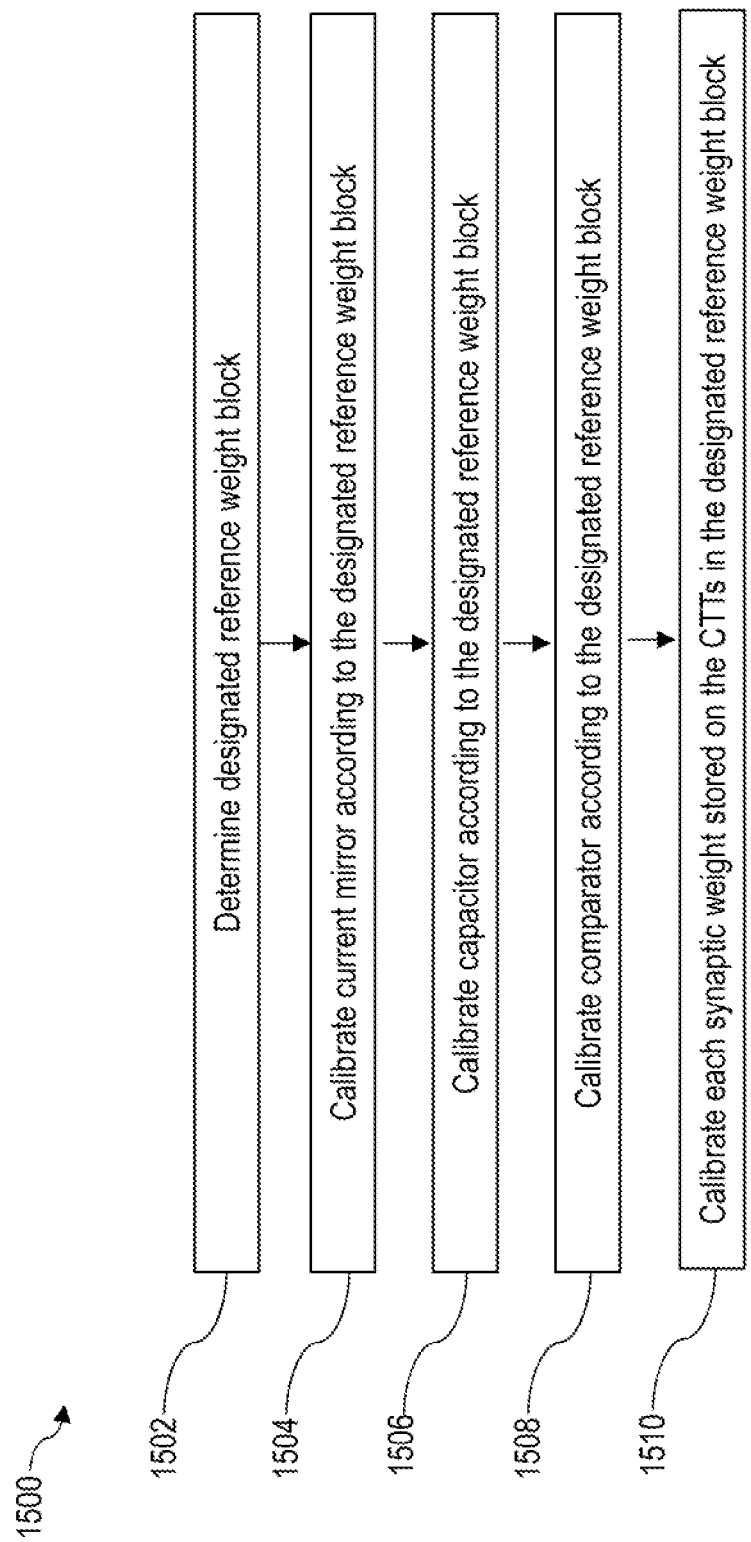
FIG. 15 is a flow diagram of a method of reference block calibration, in accordance with an embodiment.

Referring now to FIG. 15, shown therein is a method 1500 for reference block calibration, in accordance with an embodiment. The method 1500 may be implemented to calibrate the neuron 300 in FIG. 3. At 1502, the neuron 300 determines a designated reference weight block (not shown). The designated reference weight block may be a reference weight block calibrated according to a signal. The designated reference weight block, or "golden block" or "golden delay block" is a block to which all other delay blocks are calibrated.

At 1504, current mirrors (e.g., current mirrors 900 and/or 902 shown in FIGS. 9a and 9b) in the neuron 300 are calibrated according to the designated reference weight block. After calibration, the current mirror 900 or 902 is in sync with the golden delay block. At 1506, the capacitor 306 is calibrated according to the designated reference weight block. After calibration, the capacitor 306 is in sync with the golden delay block. At 1508, the comparator 314 is calibrated according to the designated reference weight block. After calibration, the comparator 314 is in sync with the golden delay block. Once this process is complete, each neuron signal path is matched relative to the single golden delay block. Advantageously, all neurons 300 may be effectively matched to each other. At 1510, each synaptic weight stored on the CTTs 700 is calibrated in the designated reference weight block.

Where components are calibrated according to a single reference weight block, for example the golden delay block, each component may keep the same relative time to advantageously improve system functioning and efficiency.

A further advantage of the present disclosure may be an ease of calibration at the neuron level and resulting ratiometric matching between all of the neurons 300 in the complete neural network (not shown). Advantageously, in order to achieve good accuracy in the ANN, the relative ratios of all of the activation/weight products may be accurate through the reference block calibration.

In an embodiment, all device behavior and all neuron signal paths are calibrated according to one designated reference weight block→current mirror→capacitor→comparator chain.

Once the reference chain has been calibrated to a unit scale time, e.g., full scale charge of a 1 pF capacitor in 1 us, all current mirror→capacitor→comparator chains may be calibrated using the same reference weight (Iref). All chains may be calibrated periodically to ensure that any small amount of drift in device characteristics is compensated for. This calibration process may advantageously efficiently calibrate out all of the differences between all of the neuron signal paths. Advantageously, calibration in the foregoing manner may succeed even if only time is stable.

Temperature compensation may be applied in at least one of two ways. In an embodiment, back bias voltage modulation is applied. In an embodiment, Vgs pulse voltage may be adjusted. Through either of the foregoing embodiments, the reference chain is maintained at unit scale time. The temperature compensation may be global. The temperature compensation may be continuous. Advantageously, the temperature compensation may ensure that only a small amount of global drift occurs due to temperature, thus keeping all of the relative errors between signal paths negligible.

Figure 16:
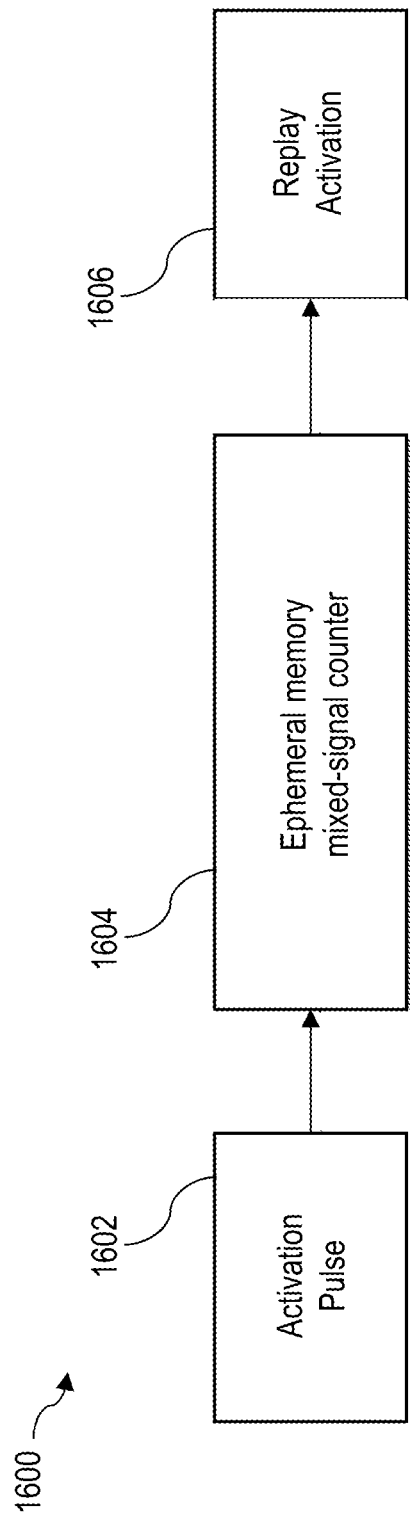
FIG. 16 is an ephemeral memory scheme in accordance with an embodiment.

Referring now to FIG. 16, shown therein is an ephemeral memory scheme 1600 for temporarily retaining information, in accordance with an embodiment. The ephemeral memory scheme 1600 is a simplified illustration of an implementation of an ephemeral memory apparatus 1700 of FIG. 17.

The ephemeral memory scheme 1600 includes activation 1602 for generating an activation pulse (not shown), an ephemeral memory mixed-signal counter 1604 for storing the activation pulse, and a replay activation 1606 for regenerating the activation pulse.

Figure 17:
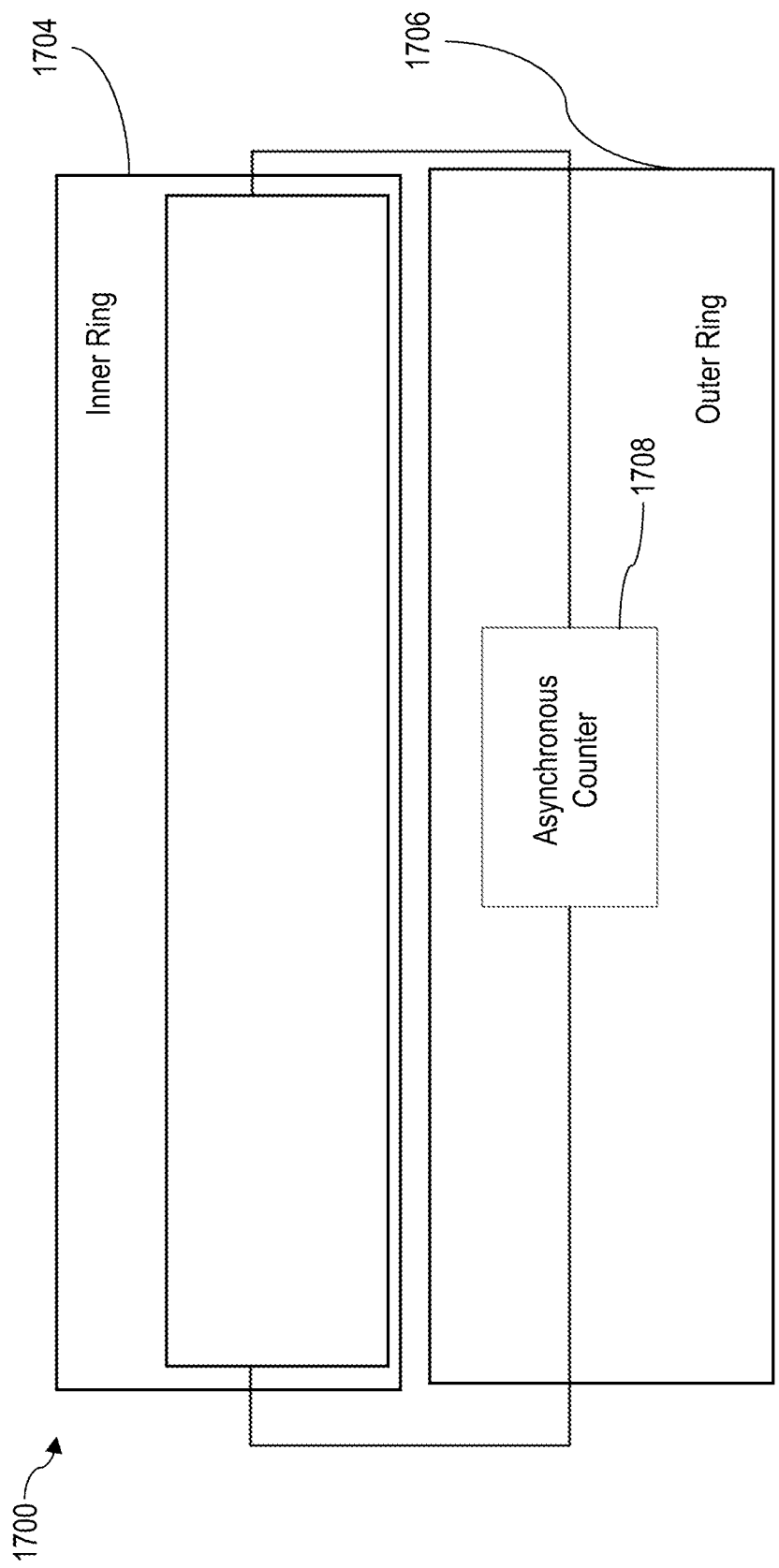
FIG. 17 is an ephemeral memory apparatus implementing the ephemeral memory scheme of FIG. 16, in accordance with an embodiment.

Referring now to FIG. 17, shown therein is an ephemeral memory apparatus 1700 for temporarily retaining information, in accordance with an embodiment. The ephemeral memory apparatus 1700 represents a generic implementation of the ephemeral memory scheme 1600 of FIG. 16. In an aspect, the information retained may be input signals received at the neuron 300 or 500. In an embodiment, the ephemeral memory apparatus 1700 may be an ephemeral memory storage.

The ephemeral memory apparatus 1700 includes an inner ring 1704 for providing asynchronous controllable delay. The inner ring 1704 is supported by an outer ring 1706 including an asynchronous counter 1708. This combination works in tandem to achieve efficient short-term accurate storage of delay state.

In the ephemeral memory apparatus 1700, a significant advantage over existing apparatus, devices, methods, and systems is that the apparatus may function asynchronously. The apparatus 1700 provides a solution to store time temporarily using nanowatt/picowatt orders of power consumption in a physically small space, which enables functionality at lower power and small silicon area.

Figure 18:
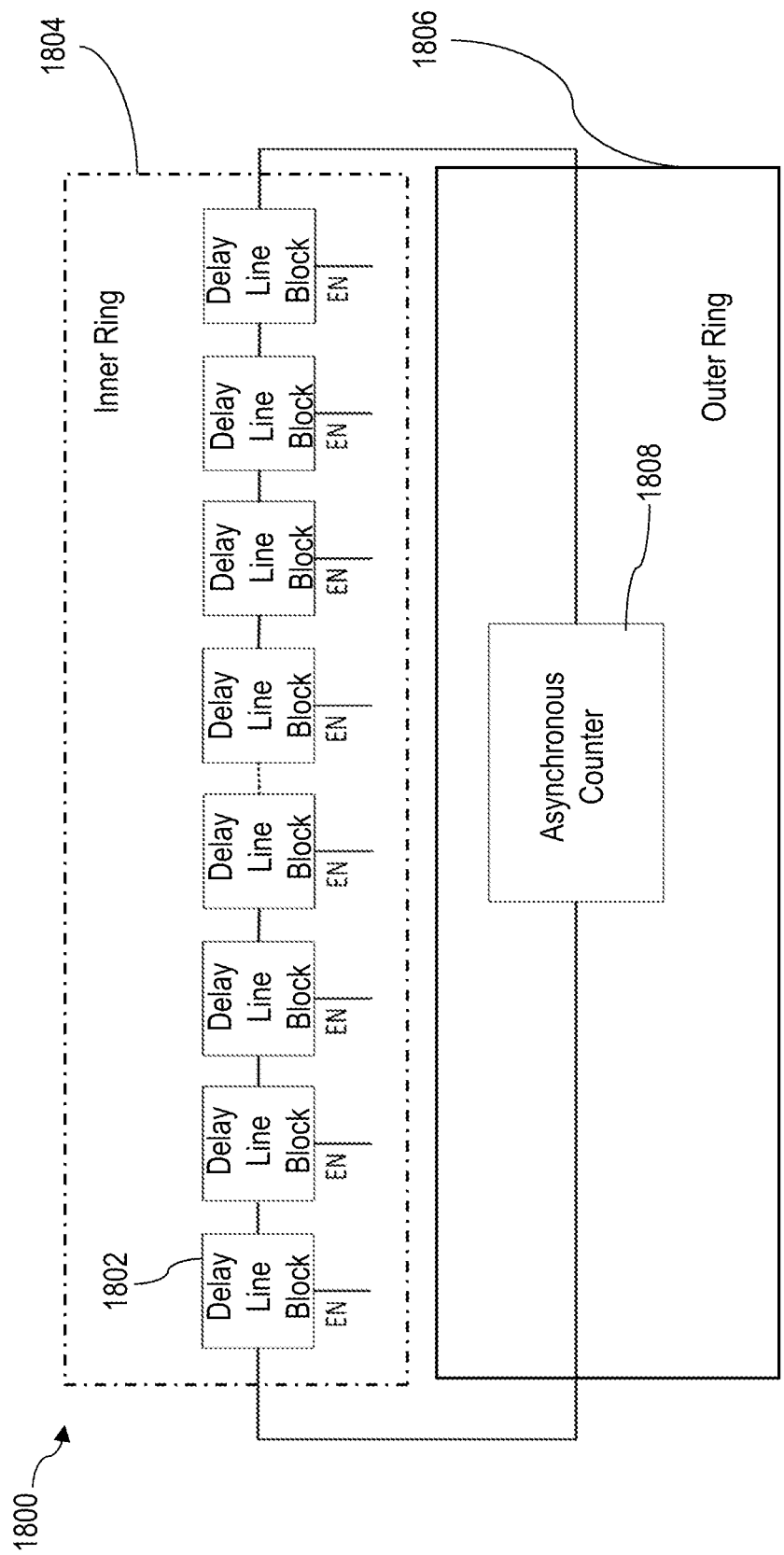
FIG. 18 is the ephemeral memory apparatus of FIG. 17 in further detail, in accordance with an embodiment.

Referring now to FIG. 18, shown therein is an ephemeral memory apparatus 1800 for temporarily retaining information, in accordance with an embodiment. The ephemeral memory apparatus 1800 is an implementation of the ephemeral memory apparatus 1700 in FIG. 17 shown in greater detail.

The apparatus 1800 includes an inner ring 1804 including a plurality of subthreshold pass transistor logic (PTL) delay line blocks 1802 for providing asynchronous controllable delay. An outer ring 1806 includes D flip-flops (not shown) forming an asynchronous counter 1808.

In the context of ephemeral, mixed-signal, time memory structure, in many artificial neural networks, a specific set of filter weights is used multiple times within a layer to process multiple activation inputs. The intermediate activations may be stored until all the values are available for the next layer to process. In an embodiment, a simple capacitor may be insufficient due to the leakage currents associated with the transistors connected to the capacitor. Therefore, the ephemeral memory apparatus 1800 may advantageously be used to store a pulse width (or time) for each activation. The ephemeral memory apparatus 1800 stores the pulse width or time in the asynchronous counter 1808, which can be used subsequently to drive a time input to the next neuron.

The inner ring 1804 acts as an oscillator (not shown) when enabled and is enabled for the time when a neuron capacitor (such as the capacitor 306 of FIG. 3) is discharging. The oscillator triggers the counter 1808 to count up when enabled. Once the neuron capacitor is discharged, the oscillator is disabled and the counter 1808 holds a value. At a subsequent time, the oscillator is enabled again and the counter 1808 counts back down to zero, during which time a pulse is generated by an asynchronous counter (not shown) as the input to the next neuron. The absolute frequency of the asynchronous counter generating the pulse is not critical. In an embodiment, only the temporary stability of the oscillation frequency is important for accuracy.

Figure 19:
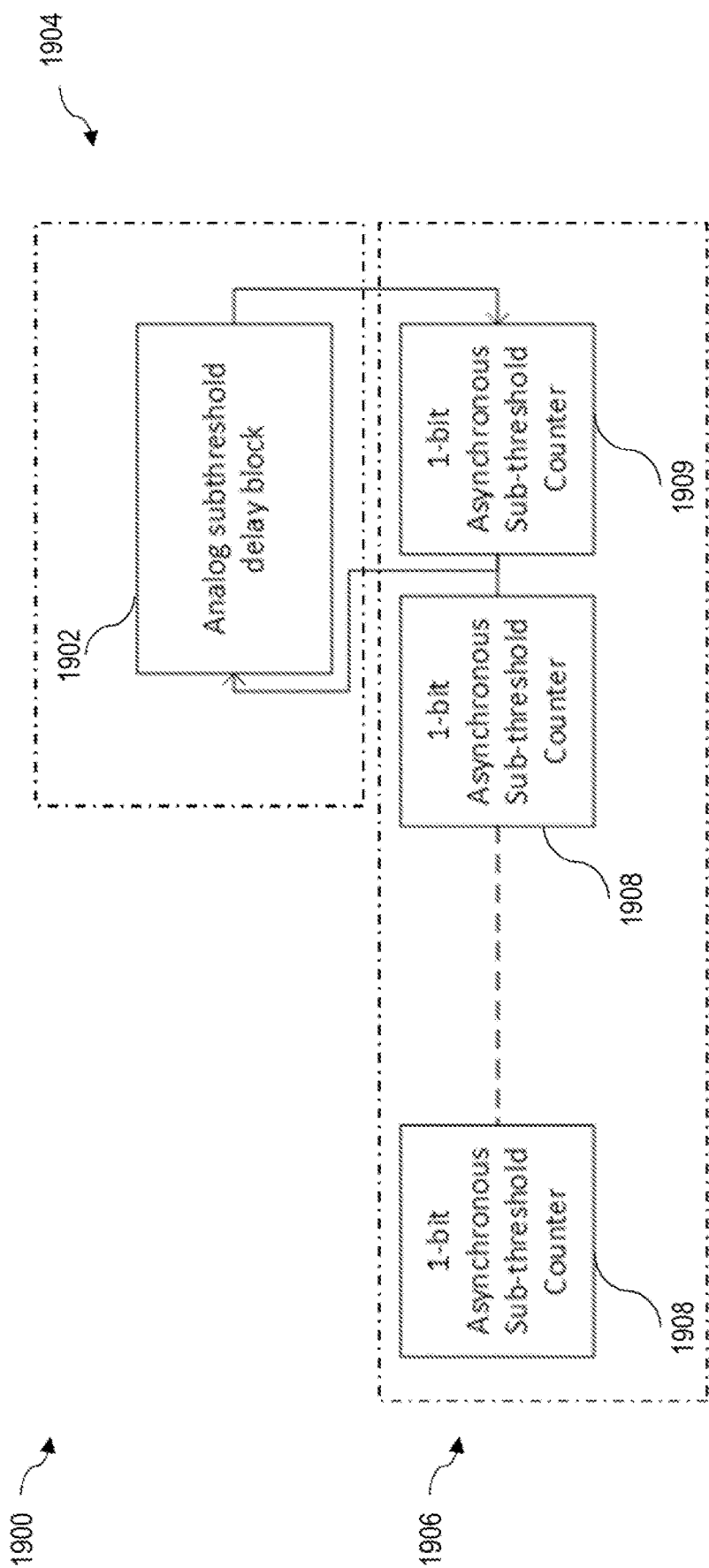
FIG. 19 is the ephemeral memory structure of FIGS. 17 and 18 in further detail, in accordance with an embodiment.

Referring now to FIG. 19, shown therein is an ephemeral memory apparatus 1900 for temporarily retaining information, in accordance with an embodiment. The ephemeral memory apparatus 1900 is an implementation of the apparatus 1700 in FIG. 17 and the apparatus 1800 shown in FIG. 18 shown in greater detail. In an embodiment, the information retained is input signals received at the neuron 300 or 500.

In an embodiment, the ephemeral memory apparatus 1900 is ephemeral memory storage.

The ephemeral memory apparatus 1900 includes an inner ring 1904 for providing asynchronous controllable delay. The apparatus 1900 further includes an outer ring 1906 for supporting the inner ring 1904. The outer ring 1906 includes asynchronous counters 1908. The asynchronous counters 1908 include a first asynchronous counter 1909. The inner ring 1904 and the outer ring 1906 function in tandem to achieve efficient short-term accurate storage of delay state.

The inner ring 1904 includes an analog subthreshold delay block 1902 for providing asynchronous controllable delay.

The asynchronous counters 1908 may be a plurality of D flip-flops.

Using the analog subthreshold delay block 1902 with positive feedback and the first asynchronous counter 1909, there may be created a self-timed oscillator (not shown) that oscillates based on a frequency of the delay elements. In the ephemeral memory apparatus 1900, the first asynchronous counter 1909 is clocked by the self-timed oscillator.

A discharge period generates an activation pulse (not shown) from a neuron, such as the neuron 300. When the activation pulse is high, the activation pulse enables the self-timed oscillator. When the activation pulse is low, the activation pulse disables the self-timed oscillator, and the asynchronous counters 1908 stop, having stored a number representing a pulse width of the activation pulse. The asynchronous counters 1908 may advantageously retain the stored number for a period of time. In an embodiment, the asynchronous counters 1908 preferably retain the stored number for several seconds.

The apparatus 1900 may advantageously use dynamic logic to save space and power.

During the activation pulse, the asynchronous counters 1908 count up during a count-up period. When the ephemeral memory apparatus 1900 is to apply the activation pulse to a subsequent neuron (such as the neuron 300), the asynchronous counters 1908 count down, enabling the analog subthreshold delay block 1902, in order to replay the process and generate a subsequent activation pulse (not shown) equal to the previous activation pulse during the count-up period. The result as depicted graphically is the dual-slope process of FIG. 6.

As the asynchronous counters 1908 count back down, the stored number may be lost. In an embodiment, the asynchronous counters 1908 may be paired with another version of the counters (not shown) running in the opposite direction, i.e., counting up when the asynchronous counters 1908 count down and vice-versa.

In an embodiment, the asynchronous counters 1908 are 1-bit asynchronous sub-threshold counters.

Further provided in FIG. 19 are examples of unit time and variation therein. In the apparatus 1900, up-counting is enabled by a storage capacitor discharge cycle. Up-counting is disabled by a threshold of a neuron, such as the neuron 300. In the apparatus 1900, down-counting is enabled by a start-of-inference signal for a subsequent layer of the ANN.

The asynchronous counters 1908 are enabled at the beginning of the discharge phase (corresponding to the slope 610 of FIG. 6). The counters 1908 are disabled when the TIQ comparator 314 flips state (i.e., when voltage currently on the capacitor 306 becomes equal to the reference voltage Vref).

In an embodiment, defects in an absolute delay provided by the analog subthreshold delay block 1902 do not prevent successful operation of the apparatus 1900 so long as the apparatus 1900 is stable for short periods (measured in milliseconds) and so long as the asynchronous counters 1908 have sufficient extra states to compensate therefor.

In the apparatus 1900, a significant advantage over existing apparatus, devices, methods, and systems is that the apparatus 1900 may function asynchronously. A solution is provided to store time temporarily in the nanowatt/picowatt power consumption space. An advantage of the present disclosure is functionality at lower power.

Figure 20:
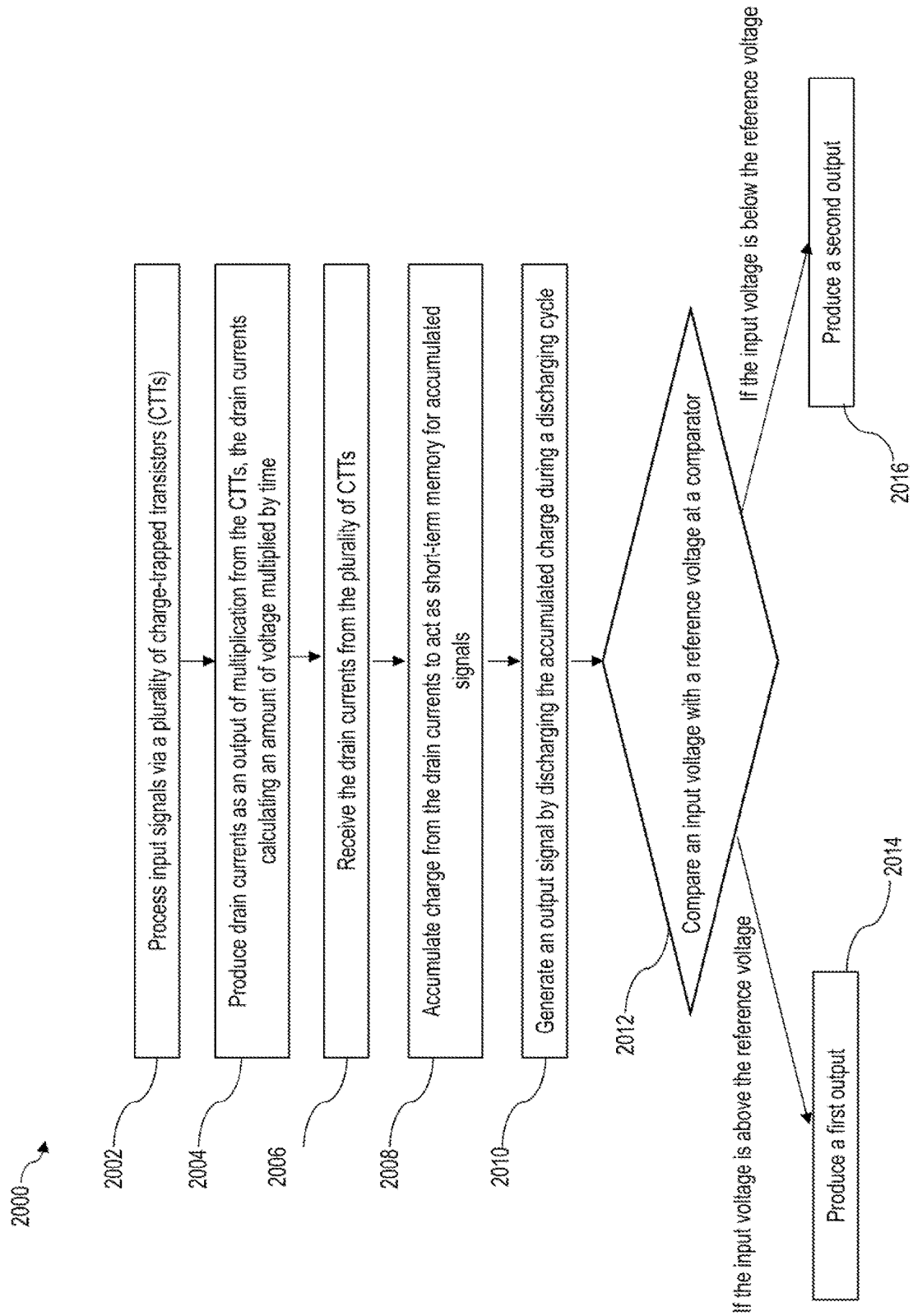
FIG. 20 is a flow diagram of a method of using an ANN, in accordance with an embodiment.

Referring now to FIG. 20, shown therein is a flow diagram of a method 2000 of using an ANN including neurons (such as the neuron 300), in accordance with an embodiment.

At 2002, input signals are processed via a plurality of CTTs 700.

At 2004, drain currents are produced as an output of multiplication from the CTTs 700. The drain currents generate an amount of charge proportionate to a period of time that a fixed voltage is applied as an input.

At 2006, the drain currents are received from the plurality of CTTs 700.

At 2008, charge from the drain currents is accumulated to act as short-term memory for accumulated signals.

At 2010, an output signal is generated by discharging the accumulated charge during a discharging cycle.

At 2012, the input voltage is compared with a reference voltage at the comparator 314. The comparator 314 may be the TIQ comparator 314.

At 2014, if the input voltage is above the reference voltage of the comparator 314, a first output is produced.

At 2016, if the input voltage is below the reference voltage of the comparator 314, a second output is produced.

In an embodiment, the first output is higher than the second output. In such an embodiment, the first output is termed a "high" output and the second output is termed a "low" output.

In an embodiment, the first output is lower than the second output. In such an embodiment, the first output is termed a "low" output and the second output is termed a "high" output.

While the above description provides examples of one or more apparatus, devices, methods, or systems, it will be appreciated that other apparatus, devices, methods, or systems may be within the scope of the claims as interpreted by one of skill in the art.

What is claimed is:

1. A system for operating an artificial neural network (ANN), the system comprising neurons, wherein each neuron comprises:
    a plurality of synapses comprising charge-trapped transistors (CTTs) for processing input signals transformed into time pulses, the CTTs supplying synaptic weights;
    an accumulation block for receiving drain currents from the plurality of synapses, each drain current produced as an output of multiplication from a synapse and each drain current producing a quantity of charge equal to a product of a time pulse received at the synapse and a synaptic weight;
    a capacitor for accumulating charge from the drain currents to act as short-term memory for accumulated signals;
    a discharge pulse generator for generating an output signal by discharging the accumulated charge during a discharging cycle; and
    a comparator for comparing the output signal as an input voltage with a reference voltage, wherein the comparator produces a first output if the input voltage is above the reference voltage, and wherein the comparator produces a second output if the input voltage is below the reference voltage, and wherein the comparator is a threshold inverter quantization (TIQ) comparator comprising a cascade of at least one complementary metal oxide semiconductor (CMOS) inverter, each CMOS inverter comprising a p-channel metal oxide semiconductor (PMOS) transistor and an n-channel metal oxide semiconductor (NMOS) transistor, wherein the reference voltage corresponds to a threshold of the TIQ comparator self-generated by the TIQ comparator, wherein the threshold of the TIQ comparator is adjustable via the PMOS transistor or the NMOS transistor, and wherein the threshold of the TIQ comparator corresponds to a ratio of a strength of the PMOS transistor divided by a strength of the NMOS transistor.

2. The system of claim 1, wherein the accumulation block comprises:
    a storage device for receiving the drain currents from the plurality of synapses; a plurality of multipliers for storing the synaptic weights and performing multiplication of the synaptic weights by the input signals; and
    an accumulator for summing the output of the multiplication from the plurality of multipliers to yield accumulated signals.

3. The system of claim 2, wherein the drain currents are produced as an output of the multiplication from the plurality of synapses and produce a quantity of charge equal to the product of the input signals and the synaptic weights.

4. The system of claim 2, wherein the drain currents connect together before connecting to the accumulation block, wherein the accumulation block sums the drain currents, and wherein the sum of the drain currents is transmitted as the accumulated signals to the capacitor for storage.

5. The system of claim 2, wherein a threshold voltage of each CTT is adjusted through programming to store a value of a weight for the corresponding synapse, wherein each CTT comprises a gate to which a voltage pulse is applied, wherein the source of the voltage pulse is at ground, wherein gate-to-source voltage is constant, and wherein the voltage pulse carries information using time.

6. The system of claim 2, wherein the current flowing through the CTTs is mirrored by a current mirror to effect an accumulation of charge on the capacitor to create a voltage proportional to a sum of weighted inputs.

7. The system of claim 1, wherein the system comprises a second reference voltage in addition to the reference voltage of the TIQ comparator or instead of the reference voltage of the TIQ comparator.

8. The system of claim 1, wherein a subset of the CTTs are NMOS CTTs.

9. The system of claim 1, wherein a subset of the CTTs are PMOS CTTs.

10. The system of claim 1, wherein each CTT comprises a high-k-metal gate, and wherein drain bias is applied during a charge-trapping process.

11. The system of claim 1, wherein each CTT comprises a gate dielectric comprising an interfacial layer of SiO2.

12. The system of claim 11, wherein each gate dielectric comprises an interfacial layer of SiO2 and a cascaded HfSiON layer.

13. The system of claim 11, wherein each CTT applies drain bias during a charge-trapping process to cause other carriers to be stably trapped in the gate dielectric.

14. The system of claim 1, wherein weight values are programmed by applying gate pulses of varying length at a set programming voltage bias, wherein during positive programming, positive gate voltage pulses are applied, and the threshold voltage shifts in a first direction, and wherein during negative programming, negative pulses are applied, and the threshold voltage shifts in a second direction opposite to the first direction.

15. A method for an artificial neural network (ANN) comprising neurons, the method comprising:
- processing input signals transformed into time pulses via a plurality of charge-trapped transistors (CTTs), the CTTs supplying synaptic weights;
- producing drain currents as an output of multiplication from the plurality of CTTs, each drain current and producing a quantity of charge equal to a product of a time pulse received at a CTT and a synaptic weight;
- receiving the drain currents from the plurality of CTTs;
- accumulating charge from the drain currents to act as short-term memory for accumulated signals;
- generating an output signal by discharging the accumulated charge during a discharging cycle by a discharge pulse generator; and
- comparing an input voltage with a reference voltage at a comparator, the comparator producing a first output if the input voltage is above the reference voltage and producing a second output if the input voltage is below the reference voltage, wherein the comparator is a threshold inverter quantization (TIQ) comparator, wherein the TIQ comparator comprises a cascade of at least one complementary metal oxide semiconductor (CMOS) inverter, each CMOS inverter comprising a p-channel metal oxide semiconductor (PMOS) transistor and an n-channel metal oxide semiconductor (NMOS) transistor, wherein the reference voltage corresponds to a threshold of the TIQ comparator self-generated by the TIQ comparator, wherein the threshold of the TIQ comparator is adjustable via the PMOS transistor or the NMOS transistor, and wherein the threshold of the TIQ comparator corresponds to a ratio of a strength of the PMOS transistor divided by a strength of the NMOS transistor.

16. The method of claim 15, wherein receiving the drain currents from the plurality of the CTTs comprises:
- receiving the drain currents from the plurality of synapses;
- storing the synaptic weights and performing multiplication of the synaptic weights by the input signals; and
- summing the output of the multiplication to yield accumulated signals.

17. The method of claim 15, wherein the method further comprises calibrating the ANN, wherein calibrating the ANN comprises:
- determining a designated reference weight block;
- calibrating a current mirror according to the designated reference weight block;
- calibrating a capacitor according to the designated reference weight block;
- calibrating the TIQ comparator according to the designated reference weight block; and
- calibrating each synaptic weight stored on the CTTs in the designated reference weight block.

* * * * *